United States Patent [19]
Onoda et al.

[11] Patent Number: 5,912,806
[45] Date of Patent: *Jun. 15, 1999

[54] IC CARD OF SIMPLE STRUCTURE

[75] Inventors: Shigeo Onoda; Katsunori Ochi; Jun Ohbuchi; Makoto Omori, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/772,520

[22] Filed: Dec. 24, 1996

[30] Foreign Application Priority Data

Mar. 25, 1996 [JP] Japan ................... P 8-067947
Sep. 25, 1996 [JP] Japan ................... P 8-252963

[51] Int. Cl.⁶ ...................................... H05K 1/14
[52] U.S. Cl. .................... 361/737; 361/752; 361/818; 439/946
[58] Field of Search ................... 361/736, 737, 361/742, 748, 749, 752, 758, 770, 816, 818; 235/380, 492, 441, 439, 487; 439/76.1, 946; 174/50; 220/3.92, 3.94, 4.02

[56] References Cited

U.S. PATENT DOCUMENTS

| | | | |
|---|---|---|---|
| 5,339,222 | 8/1994 | Simmons et al. | 361/818 |
| 5,409,385 | 4/1995 | Tan et al. | 439/76 |
| 5,536,905 | 7/1996 | Redman et al. | 174/35 GC |

FOREIGN PATENT DOCUMENTS

| | | |
|---|---|---|
| A4-161393 | 6/1992 | Japan . |
| A6-171275 | 6/1994 | Japan . |

*Primary Examiner*—Leo P. Picard
*Assistant Examiner*—Phuong T. Vu

[57] ABSTRACT

An IC card (1) has a shape of a substantially flat rectangular parallelepiped. The IC card (1) has electronic devices (2) including integrated circuits, a substrate (3) and a frame (5) for supporting the electronic devices (2), a first panel (6c) covering the upper surface of the frame (5), and a second panel (6d) covering the lower surface of the frame (5). Hereupon, the first panel (6c) is directly mounted to the frame (5) in such a manner that each of the left and right end portions (15) of the first panel (6c) is bent twice in accordance with the outer surface of the frame (5) and further each of edges of the left and right end portions (15) is fastened to the lower surface of the frame (5).

8 Claims, 16 Drawing Sheets

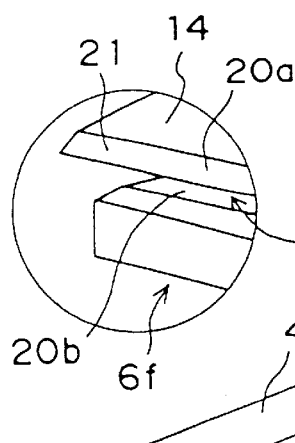
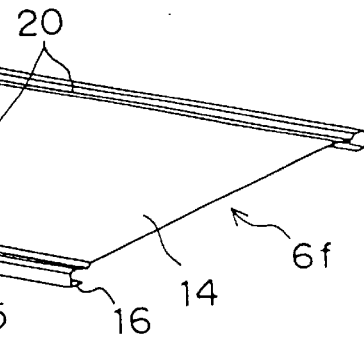
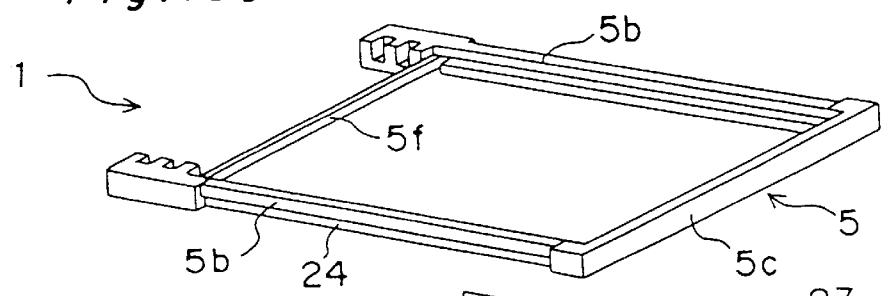
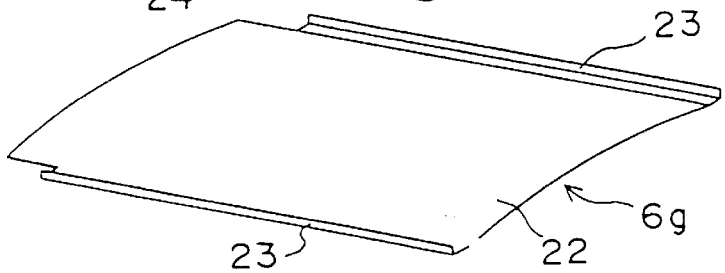
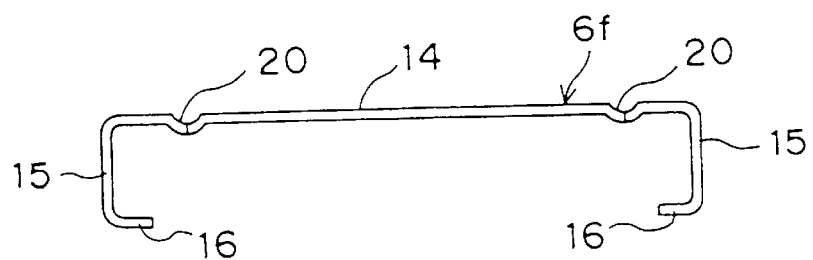

IC CARD OF SIMPLE STRUCTURE

FIELD OF THE INVENTION

The present invention relates to an IC (integrated circuit) card, and particularly to a technique for simplifying both of a structure of the IC card and a manufacturing process of the IC card.

DESCRIPTION OF THE PRIOR ART

There is conventionally well known an IC card in which electronic devices or the like including integrated circuits are accommodated within a casing having a card-like shape or a thin plate shape. In FIGS. 34 to 36, there is shown an example of the above-mentioned type of conventional IC card. Hereupon, FIG. 34 is a general perspective view of the IC card. Meanwhile, FIG. 35 is a section view of the IC card along line XXXV—XXXV in FIG. 34, and further FIG. 36 is an exploded perspective view of the IC card illustrating the internal structure thereof.

As shown in FIGS. 34 to 36, the IC card 1 is provided with electronic devices 2, each of which includes an integrated circuit (not shown) therein. The electronic devices 2 are loaded on (attached to) a substrate 3. Further, the IC card 1 is provided with a connector 4 for sending signals to or receiving signals from a system device (not shown), the connector 4 being connected to the substrate 3. Moreover, the IC card 1 is provided with a frame 5 made of resin for supporting and housing both of the connector 4 and the substrate 3 loading the electronic devices 2. Still further, the IC card 1 is provided with a first panel 6a (upper panel) and a second panel 6b (lower panel) each of which is made of metal and adhered (fixed) to the frame 5. The first panel 6a overspreads the upper surface of the substrate 3 loading the connector 4 and the electronic devices 2, while the second panel 6b overspreads the lower surface of the substrate 3. Hereupon, the first and second panels 6a and 6b are adhered or fixed to the frame 5 by means of adhesive sheets 7a and 7b, respectively.

However, in the above-mentioned conventional IC card 1, there is such a problem that the price of the IC card 1 is relatively high. Therefore, in order to promote the spread of the IC card 1, it is desired to lower the price of the IC card 1. Thus, for the sake of lowering the price of the IC card 1, it is required to simplify the structure of the IC card 1. Further, it is also required to simplify the manufacturing process of the IC card 1 In particular, when the conventional IC card 1 having the above-mentioned structure is manufactured, it is required that each of the adhesive sheets 7a and 7b is provisionally attached onto the corresponding panel 6a or 6b in such a manner that each of the adhesive sheets 7a and 7b is accurately positioned at a predetermined position without causing positional deviation, and then each of the first and second panels 6a and 6b is pressed against the frame 5 with the pressing force of about 50 Kg under the temperature of about 150° C. so as to be adhered to the frame 5. Therefore, in the assembling process of the IC card 1, a particular assembling apparatus is required.

SUMMARY OF THE INVENTION

The present invention has been developed to solve the above-mentioned conventional problems, and has an object of providing an IC card which has a simple structure and can be manufactured by a simplified process.

Thus, according to a first aspect of the present invention which is developed to achieve the above-mentioned object, there is provided an IC card which has a shape of a substantially flat rectangular parallelepiped, the IC card having, at least one electronic device including an integrated circuit, a frame for supporting the electronic device, the frame having a first and a second frame end surfaces (upper and lower surfaces) both of which are faced toward opposite directions to each other in a thickness direction of the IC card, a first panel for covering the first frame end surface, and a second panel for covering the second frame end surface. In the IC card, the first panel is directly mounted to the frame in such a manner that each of both end portions of the first panel in a width direction of the IC card is bent at least twice in accordance with an outer surface of the frame within at least a partial region of the IC card in a longitudinal direction of the IC card and further each of edges of the both end portions is fastened to the second frame end surface.

Hereupon, "thickness direction of the IC card" means the direction along which the thickness of the IC card increases or decreases, namely the direction which is perpendicular to the substantially rectangular spreading surface (upper or lower surface) of the IC card. Meanwhile, "longitudinal direction of the IC card" means the direction along which a long side of the rectangle of the spreading surface extends, and further "width direction of the IC card" means the direction along which a short side of the rectangle of the spreading surface extends.

In the above-mentioned IC card, the first panel covers the side surfaces of the frame while bending along the outer surface of the frame, and further is fastened to the second frame end surface. Thus, the first panel is mounted to the frame without using adhesive materials (for example, adhesive sheets). Therefore, the structure of the IC card is simplified and also the manufacturing process of the IC card is simplified. In consequence, the manufacturing cost of the IC card is lowered.

Further, since the both side surfaces (extending in the longitudinal direction of the IC card) of the IC card are covered with the first panel, anti electromagnetic wave properties of the IC card (for example, electromagnetic wave shielding property) are improved. Moreover, if the IC card is provided with a connecter of such a type that electric charges charged to the IC card are discharged to the ground through the side surfaces of the IC card, the electric charges can be discharged without providing a particular contact point for discharging with the IC card. Still further, since the first panel and the second panel contact to each other on the second frame end surface, the both panels are electrically conductive to each other. Therefore, counterplan for ESD (counterplan against static electricity) can be achieved without providing a particular conducting mechanism for interconnecting the both panels to each other. In consequence, the quality of the IC card is improved.

In the above-mentioned IC card, it is preferable that a spreading portion of the first panel is formed in such a manner that a section of the spreading portion cut by a plane perpendicular to the longitudinal direction of the IC card has a curved shape projecting inwardly in the thickness direction of the IC card under a condition that the first panel is detached from the frame. Hereupon, the spreading portion of the first panel corresponds to the upper surface of the IC card. In this case, when the first panel is attached to the frame, the spreading portion, which is originally curved, is flattened while causing an elastic deformation thereof. Hereupon, in the first panel, there is caused an elastic or restitutive force (stress) which compels the first panel to return to the original curved state. Since the elastic or restitutive force acts in such a direction that the first panel is pressed to the frame, the first panel is strongly pressed to the frame by the elastic or restitutive force. Therefore, the first panel closely contacts with the frame, and consequently it is prevented that the first panel swells outward. In consequence, the quality of the IC card is further improved.

Moreover, in the above-mentioned IC card, it is more preferable that the first panel is formed in such a manner that an angle of a bending portion formed of a spreading portion of the first panel and a side portion of the first panel to contact with a side surface of the frame is an acute angle in a view point of a section of the first panel cut by a plane perpendicular to the longitudinal direction of the IC card under a condition that the first panel is detached from the frame. In this case, when the first panel is attached to the frame, the bending portion, which is originally angled acutely, is rectangularly angled while causing an elastic deformation thereof. Hereupon, in the bending portion of the first panel, there is caused an elastic or restitutive force which compels the bending portion to return to the original acute state. Since the elastic or restitutive force acts in such a direction that the first panel is pressed to the frame, namely the first panel is hooked to the frame, the first panel closely contacts with the frame by the elastic or restitutive force, and consequently it is prevented that the first panel swells outward or leaves the frame. In consequence, the quality of the IC card is much further improved.

Still further, in the above-mentioned IC card, it is much more preferable that the second panel is made of a thin plate material whose thickness is smaller than that of the first panel. In this case, since the material cost of the second panel is reduced, the manufacturing cost of the IC card is further lowered.

In addition, in the above-mentioned IC card, it is further preferable that the first panel is provided with a rib at each of both end regions of the spreading portion thereof in the width direction of the IC card, the rib extending in the longitudinal direction of the IC card and projecting (for example, with a U-shape or a V-shape) toward the frame so as to join with the frame. In this case, the stiffness (rigidity) of the first panel is improved by the ribs so that the stiffness (rigidity) of the IC card is improved. Further, the coherence between the first panel and the frame is raised by the ribs. In consequence, the quality of the IC card much more improved.

Hereupon, it is more preferable that the ribs are formed after the first panel has been attached to the frame. The ribs are formed by means of a conventional well known process, for example such a process including the step of striking or pressing a predetermined portions in the spreading portion toward the frame using dies or the like. In this case, even if the size of the spreading portion of the first panel in the width direction of the IC card is slightly larger than the standard size, the spreading portion is slightly shortened in the width direction of the IC card when the ribs are formed so that the coherence between the first panel and the frame is raised.

When the ribs are formed by means of the above-mentioned process, if grooves for the ribs have been formed on the first frame end surface, the ribs can be formed or processed surely and easily, and further the depth (height) of each of the ribs can be easily adjusted. Hereupon, each of the grooves is formed at a position capable of associating with the corresponding rib, and has a shape capable of fitting with the rib. In this case, since the ribs can be formed or processed surely and easily, the manufacturing process of the IC card is further simplified.

Further, in the above-mentioned IC card, it is preferable that the first panel is provided with dowels at each of both end regions of the spreading portion thereof in the width direction of the IC card, the dowels projecting toward the frame so as to join with the frame. Hereupon, the dowels may be provided at each of both side regions of the first panel. In these cases, the coherence between the first panel and the frame is raised by the dowels. Further, by the dowels, it is prevented that there is caused a slip between the first panel and the frame so that the overall stiffness of the IC card is improved. In consequence, the quality of the IC card is highly improved.

Hereupon, it is also preferable that the dowels are formed after the first panel has been attached to the frame. The dowels are formed by means of a conventional well known process, for example such a process including the step of striking or pressing a predetermined portions in the spreading portion toward the frame using dies or the like.

In an IC card according to a second aspect of the present invention, the second panel is directly mounted to the frame in such a manner that each of both end portions of the second panel in the width direction of the IC card is bent in accordance with the outer surface of the frame within at least a partial region of the IC card in the longitudinal direction of the IC card and further each of edges of the both end portions is fastened to the frame. Further, the first panel is directly mounted to the frame in such a manner that each of both end portions of the first panel in the width direction of the IC card is bent at least twice outside the second panel in accordance with the outer surface of the frame within at least the partial region of the IC card in the longitudinal direction of the IC card and further each of edges of the both end portions is fastened to the second frame end surface.

Thus, in the IC card according to the second aspect, since the both panels are fastened to the frame while bending along the outer surface of the frame, the both panels can be mounted to the frame without using adhesive materials. Therefore, the structure of the IC card is highly simplified and also the manufacturing process of the IC card is highly simplified. In consequence, the manufacturing cost of the IC card is effectively lowered.

Further, since the both end portions of the second panel, which are fastened to the frame, are covered with the first panel, the view or external appearance of the IC card is improved. Moreover, in the IC card according to the second aspect, there are achieved following operations or effects, as well as the IC card according to the first aspect. Namely, anti electromagnetic wave properties of the IC card are improved. And, electric charges can be discharged without providing a particular contact point for discharging In addition, a counterplan for ESD can be achieved without providing a particular conducting mechanism for interconnecting the both panels to each other. In consequence, the quality of the IC card is highly improved.

In an IC card according to a third aspect of the present invention, the frame is provided with convex portions swelling in the width direction of the IC card and concave portions sinking in the width direction of the IC card at each of both side portions of the frame, the both side portions being located at opposite end positions in the width direction of the IC card, respectively. And, the second panel is directly mounted to the frame in such a manner that each of protruding portions formed at both end portions of the second panel in the width direction of the IC card is bent in accordance with the outer surface of the concave portion corresponding to the protruding portion within at least a partial region of the IC card in the longitudinal direction of the IC card and further an edge of the protruding portion is fastened to the frame. In addition, the first panel is directly mounted to the frame in such a manner that each of both end portions of the first panel in the width direction of the IC card is bent at least twice outside the second panel in accordance with outer surfaces of the convex portions within at least the partial region of the IC card in the longitudinal direction of the IC card and further each of edges of the both end portions is fastened to the second frame end surface. Hereupon, it is preferable that the second panel is mounted to the frame by fixing an end portion of each of the protruding portions thereof into an interval formed between the first frame end surface and the first panel. In this case, the second panel may be easily mounted to the frame.

Thus, in the IC card according to the third aspect; there are achieved following operations or effects; as well as the IC card according to the second aspect. Namely, the structure of the IC card is effectively simplified and also the manufacturing process of the IC card is effectively simplified. And, the view or external appearance of the IC card is improved. Further, anti electromagnetic wave properties of the IC card are improved. Moreover, electric charges can be discharged without providing a particular contact point for discharging. In addition; a counterplan for ESD can be achieved without providing a particular conducting mechanism for interconnecting the both panels to each other. In consequence, the manufacturing cost of the IC card is effectively lowered, and the quality of the IC card is effectively improved.

In an IC card according to a fourth aspect of the present invention, the first panel is provided with a wide portion and a narrow portion each of which is a part of the first panel and located adjacent to each other in the longitudinal direction of the IC card, the narrow portion having a size in the width direction of the IC card smaller than that of the wide portion. Hereupon, the first panel is directly mounted to the frame in such a manner that each of both end portions of the first panel in the width direction of the IC card is bent at least twice in accordance with the outer surface of the frame within the wide portion and further each of edges of the both end portions is fastened to the second frame end surface. Further, the wide portion of the first panel is provided with a joining rib at each of both end regions of the spreading portion thereof in the width direction of the IC card, the joining rib extending in the longitudinal direction of the IC card and projecting with a U-shape or V-shape toward the frame so as to join with the frame. Moreover, the narrow portion of the first panel is provided with a stiffening rib at each of both end regions thereof in the width direction of the IC card, the stiffening rib being formed by extending a slanted half wall of the U-shaped or V-shaped joining rib longitudinally, and the half wall being located at inner side in the width direction of the IC card.

Thus, in the IC card according to the fourth aspect, since the stiffness of the narrow portion which is provided with no joining ribs is raised by the stiffening ribs, it is prevented that the narrow portion bends up or swells outward from the frame so that the stiffness of the first panel is improved. Further, there are achieved following operations or effects, as well as the IC card according to the first aspect. Namely, anti electromagnetic wave properties of the IC card are improved. Moreover, electric charges can be discharged without providing a particular contact point for discharging. In addition, a counterplan for ESD can be achieved without providing a particular conducting mechanism for interconnecting the both panels to each other. In consequence, the quality of the IC card is effectively improved.

In an IC card according to a fifth aspect of the present invention, the second panel is directly mounted to the frame in such a manner that each of both end portions of the second panel in the width direction of the IC card is bent in accordance with the outer surface of the frame within at least a partial region of the IC card in the longitudinal direction of the IC card. Further, the frame is provided with a cut-out at each of both end portions of the frame in the width direction of the IC card in vicinity of the second end surface, the cut-out being formed by cutting away a part of the frame to inside of an end of the second panel in the width direction of the IC card. Moreover, the first panel is directly mounted to the frame in such a manner that each of both end portions of the first panel in the width direction of the IC card is bent at least twice in accordance with the outer surface of the frame within at least the partial region of the IC card in the longitudinal direction of the IC card so as to cover the second panel and further each of edges of the both end portions is fastened to the outer surface of the second panel. Hereupon, it is preferable or necessary that a void is formed between an end of the second panel and an outer surface of the cut-out in the width direction of the IC card. In this case, the second panel may be more easily displaced or deformed.

Thus, in the IC card according to the fifth aspect, when the IC card is assembled, the first panel is mounted to the frame after the second panel has been mounted to the frame already. Hereupon, when the first panel is mounted to the frame, if the both end portions of the second panel are temporarily displaced (moved) inwardly in the width direction of the IC card, namely the length of the second panel in the width direction of the IC card is temporarily shortened, by elastically deforming the second panel, which has been mounted to the frame already, so as to swell outward, or by applying pressing force in the width direction of the IC card, the first panel may be mounted to the frame without spreading itself so much in the width direction of the IC card. Therefore, when the first panel is mounted to the frame, it is restrained that the first panel is deformed to reach its permanent deformation region, namely plastical deformation region. In consequence, the associating length (hook length) of the portion of the first panel to associate with the second panel can be increased so that the first panel can be surely mounted to the frame.

In addition, in the IC card according to the fifth aspect, there are achieved following operations or effects, as well as the IC card according to the second aspect. Namely, the structure of the IC card is effectively simplified and also the manufacturing process of the IC card is effectively simplified. And, the view or external appearance of the IC card is improved. Further, anti electromagnetic wave properties of the IC card are improved. Moreover, electric charges can be discharged without providing a particular contact point for discharging. Still further, a counterplan for ESD can be achieved without providing a particular conducting mechanism for interconnecting the both panels to each other. In consequence, the manufacturing cost of the IC card is effectively lowered, and the quality of the IC card is effectively improved.

In an IC card according to a sixth aspect of the present invention, the second panel is directly mounted to the frame in such a manner that each of both end portions of the second panel in the width direction of the IC card is bent in accordance with the outer surface of the frame within at least a partial region of the IC card in the longitudinal direction of the IC card and further each of edges of the both end portions is fastened to the frame. Hereupon, a spreading portion of the second panel is formed in such a manner that a section of the spreading portion cut by a plane perpendicular to the longitudinal direction of the IC card has two convex curved portions projecting outwardly each of which is located near a corresponding end of the spreading portion and departs from the frame in the width direction of the IC card, under a condition that the second panel is detached from the frame. Meanwhile, the first panel is directly mounted to the frame in such a manner that each of both end portions of the first panel in the width direction of the IC card is bent outside of the second panel in accordance with the outer surface of the frame within at least the partial region of the IC card in the longitudinal direction of the IC card and further each of edges of the both end portions is fastened to the second frame end surface. Hereupon, a spreading portion of the first panel is formed in such a manner that a section of the spreading portion cut by the plane perpendicular to the longitudinal direction of the IC card has two convex curved portions projecting outwardly each of which is located near a corresponding end of the spreading portion and departs from the frame in the width direction of the IC card, under a condition that the first panel is detached from the frame.

Thus, in the above-mentioned IC card, when the first panel is attached to the frame, the spreading portion, which is originally curved, is flattened while causing an elastic deformation thereof. Hereupon, in the first panel, there is caused an elastic or restitutive force (stress) which compels the first panel to return to the original curved state. Since the elastic or restitutive force acts in such a direction that the first panel is pressed to the frame, the first panel is strongly pressed to the frame by the elastic or restitutive force. Therefore, the first panel closely contacts with the frame, and consequently it is prevented that the first panel swells outward. In consequence, the quality of the IC card is further improved. Similarly, the second panel also contacts closely with the frame, and consequently it is prevented that the second panel swells outward.

In the IC card according to the sixth aspect of the present invention, it is preferable that the spreading portion of each of the first and second panels is formed in such a manner that the section of the spreading portion cut by the plane perpendicular to the longitudinal direction of the IC card has a straight shape between the both convex curved portions in the width direction of the IC card under the condition that the first or second panel is detached from the frame. In this case, the spreading portion of the first or second panel may be easily formed into the predetermined shape, and in consequence the manufacturing cost of the IC card may be further lowered.

In the IC card according to the sixth aspect of the present invention, the spreading portion of each of the first and second panels may be formed in such a manner that the section of the spreading portion cut by the plane perpendicular to the longitudinal direction of the IC card has a curved shape projecting inwardly between the both convex curved portions in the width direction of the IC card under the condition that the first or second panel is detached from the frame. In this case, the spreading portion of the first or second panel is inwardly curved at the center portion thereof in the width direction of the IC card. Therefore, the first or second panel may contact more closely to the frame so that the quality of the IC card is further improved.

An IC card according to a seventh aspect of the present invention is provided with a connector for connecting the electronic device to an outer device, the connector being set in a portion of the frame near an end of the frame in the longitudinal direction of the IC card. Further, the IC card is provide with a hook portion with an elasticity which is formed in the second panel. Hereupon, the hook portion is located at a position corresponding to the connector. In addition, the IC card is provided with a slit (or slot) formed in the frame through which the hook portion can be threaded. Hereupon, the slit is located at a position corresponding to the hook portion. Thus, the hook portion is threaded through the slit and hooked to an ear portion of the connector.

Thus, in the above-mentioned IC cards since the hook portion of the second panel is hooked to the ear portion of the connectors the connective strength between the second panel and the connector may be raised. In consequence, the connective strength between the frame and the connector may be raised. Further, the connecting strength between the second panel and the corner portion of the frame may be raised. Thus, the quality of the IC card is much further improved.

BRIEF DESCRIPTION OF THE DRAWINGS

These and other objects, features and advantages of the present invention will become clear from the following description taken in conjunction with the preferred embodiments with reference to the accompanying drawings throughout which like parts are designated by like reference numerals, and in which:

FIG. 18 is an exploded perspective view of an IC card according to another embodiment of the present invention;

FIG. 19 is a front view of a first panel which is a component of the IC card shown in FIG. 18;

DETAILED DESCRIPTION OF THE PREFERRED EMBODIMENT

Hereinafter, some preferred embodiments of the present invention will be concretely described with reference to the accompanying drawings.

First Embodiment

Figure 1:
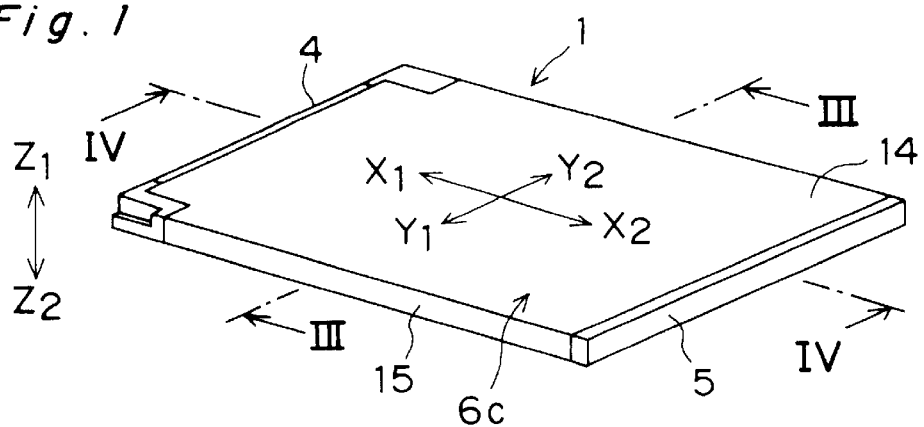
FIG. 1 is a general perspective view of an IC card according to an embodiment of the present invention.

Hereinafter, an IC card according to a first embodiment of the present invention will be described As apparent from FIG. 1, the external shape of the IC card is a substantially flat rectangular parallelepiped, and consequently each of the both spreading surfaces (upper and lower surfaces) of the IC card has a shape of a substantial rectangle. Hereinafter, in order to clarify positional relations in the IC card, X1–X2 direction in FIG. 1, namely the direction along which a long side of the rectangle of the spreading surface of the IC card extends, will be merely referred to "longitudinal direction (of the IC card)", and also X1 and X2 sides will be referred to "front" and "rear", respectively. Further, Y1–Y2 direction in FIG. 1, namely the direction along which a short side of the above-mentioned rectangle extends, will be merely referred to "width direction (of the IC card)", and also Y1 and Y2 sides will be referred to "left" and "right", respectively. In addition, Z1–Z2 direction in FIG. 1, namely the direction along which the thickness of the IC card increases or decreases, will be merely referred to "thickness direction (of the IC card)", and also Z1 and Z2 sides will be referred to "upper" and "lower", respectively. Further, the above-mentioned expression about the positional relations may be fundamentally applied to the other embodiments which will be described later.

As shown in FIGS. 1 to 4, the IC card 1 is provided with a plurality of electronic devices 2, each of which includes at least one integrated circuit, namely IC, (not shown) therein. The electronic devices 2 are loaded on a substrate 3. Further, the IC card 1 is provided with a connecter 4 for sending signals to or receiving signals from a system device or an outer device (not shown), the connecter 4 being connected to the substrate 3. Moreover, the IC card 1 is provided with a frame 5 made of resin for supporting and housing the connecter 4 and the substrate 3 loading the electronic devices 2. In the IC card 1, the electronic devices 2 are loaded only on the lower surface of the substrate 3.

The frame 5 made of resin is substantially composed of a bottom plate 5a which has a flat shape and is located at the lower end position of the frame 5, two side frames 5b which extend in the longitudinal direction of the IC card 1 and are located at left and right end positions of the frame 5 respectively, and a rear frame 5c which extends in the width direction of the IC card 1 and is located at the rear end position of the frame 5. Hereupon, these portions 5a, 5b and 5c are integrally formed. The frame 5 is made by means of forming process using, for example, polybutylene terephthalate (PBT) resin, polycarbonate (PC) resin or the like.

Figure 35:
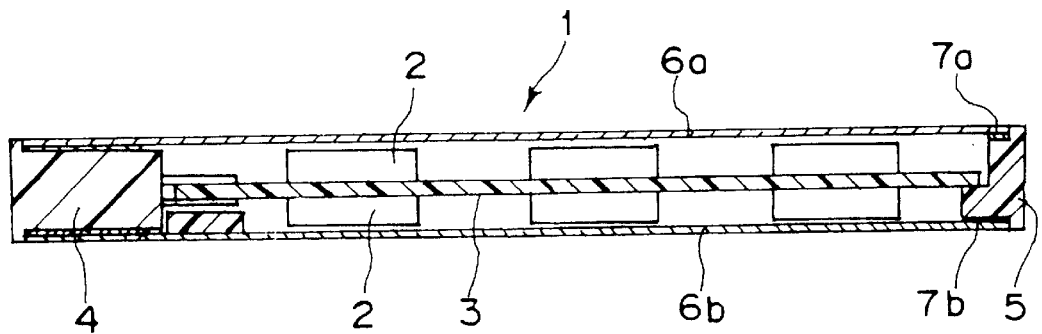
FIG. 35 is a section view of the IC card shown in FIG. 34 along line XXXV—XXXV in FIG. 34.
Figure 36:
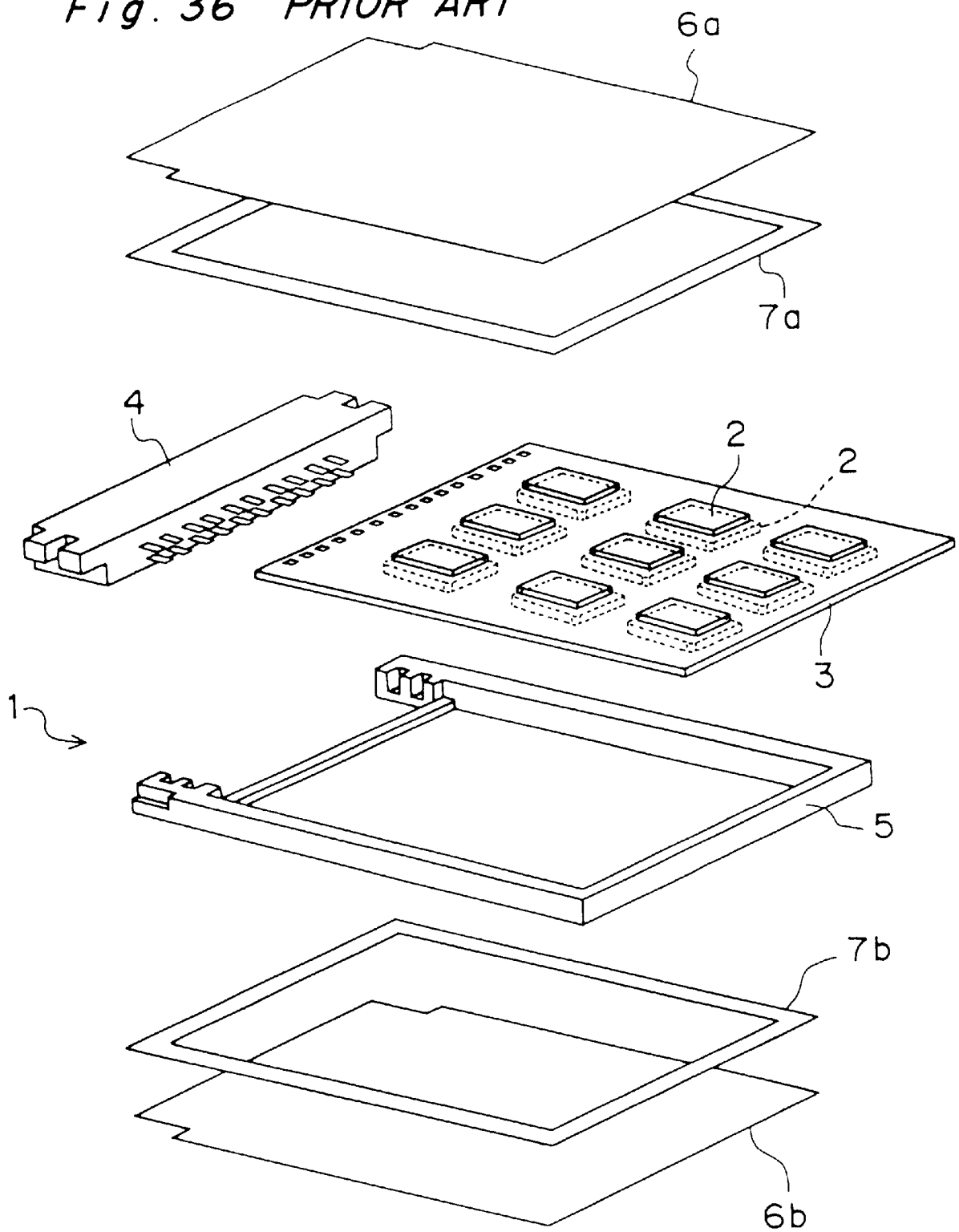
FIG. 36 is an exploded perspective view of the IC card shown in FIG. 34.

The IC card 1 is provided with a first panel 6c (upper panel) made of metal, which is associated with the upper surface (first frame end surface) of the frame 5 and forms the substantially rectangular upper spreading surface of the IC card 1 Further, the IC card 1 is provided with a second panel 6d (lower panel) made of metal, which is associated with the lower surface (second frame end surface) of the frame 5 and forms the substantially rectangular lower spreading surface of the IC card 1 In the IC card 1, since the both panels 6c and 6d are directly mounted to the frame 5, such adhesive sheets (see FIG. 35 or 36) as are used in the conventional IC card, are not provided. Hereupon, the first panel 6c is preferably made of stainless steel. Further, although the second panel 6d is also preferably made of stainless steel, it may be made of aluminum.

The connecter 4 is mounted to the substrate 3 loading the electronic devices 2 by means of solder processing. Hereupon, the connecter 4 is electrically connected with the substrate 3 by joining each of a plurality of connecter side contacts 12 provided thereto with the corresponding one of a plurality of substrate side contacts 13 provided to the substrate 3. Further, an assembly formed by combining the connecter 4 with the substrate 3 (generally called "module") is mounted to the frame 5 by pressure fitting processing or caulk joining processing.

The first panel 6c is directly mounted to the frame 5 without using adhesive sheets in such a manner that each of left and right end portions thereof is bent twice in accordance with the outer surface of the corresponding side frame 5b except a little region near the front end portion thereof and further each of edges of the both left and right end portions is fastened to the lower surface of the corresponding side frame 5b. Hereupon, before the first panel 6c is mounted to the frame 5, each of the left and right end portions of the first panel 6c has been already bent twice so as to fit with the outer surface of the corresponding side frame 5b so that the first panel 6c has been provided with a spreading portion 14, two side portions 15 and two hook portions 16. Thus, when the first panel 6c is mounted to the frame 5, at first the left and right side portions 15 are spread to left and right respectively by hand working or by using a suitable tool. After this, the first panel 6c is put on the side frames 5b, and then each of the hook portions 16 (edges) is fastened to the lower surface of the corresponding side frame 5b. Hence, the first panel 6c is surely fixed to the frame 5. Hereat, on the upper surface of each of the side frames 5b, there is formed a stepwise lowered portion at the position to contact with the first panel 6c, the height of the stepwise lowered portion being smaller than that of the rear frame portion 5c by the thickness of the first panel 6c. Therefore, after the first panel 6c has been mounted to the frame 5, the upper spreading surface of the IC card 1 is entirely flat. Namely, there is not caused a height difference between the upper surface of the first panel 6c and the upper surface of the rear frame 5c. on the other hand, the second panel 6d is adhered to the lower surface of the bottom plate 5a of the frame 5 using a adhesive material. Hereupon, since the adhesive material has been already applied on the surface of the second panel 6d before the second panel 6d is adhered to the frame 5, the second panel 6d may be easily adhered to the frame 5.

Thus, in the IC card 1 according to the present invention, since adhesive sheets are not used in comparison with the conventional IC card, the number of parts thereof is reduced so that the structure of the IC card 1 is simplified. Further, since it is not required such processing of attaching adhesive sheets provisionally onto the panels nor of pressing the panels against the frame using a particular apparatus, the manufacturing process of the IC card 1 is simplified.

Further, since the left and right side surfaces of the IC card 1 are covered with the first panel 6c, anti electromagnetic wave properties of the IC card 1, for example electromagnetic wave shielding property, are improved. Moreover, if the connecter 4 is such a type of connecter that electric charges charged to the IC card 1 are discharged to the ground through the left and right side surfaces of the IC card 1, the electric charges can be discharged without providing a particular discharging contact point with the IC card 1. Still further, since the first panel 6c and the second panel 6d contact to each other on the lower surface of the frame 5, the both panels 6c and 6d are electrically conductive to each other. Therefore, a counterplan for ESD (counterplan against static electricity) can be achieved without providing a particular conducting mechanism for interconnecting the both panels to each other.

Second Embodiment

Figure 2:
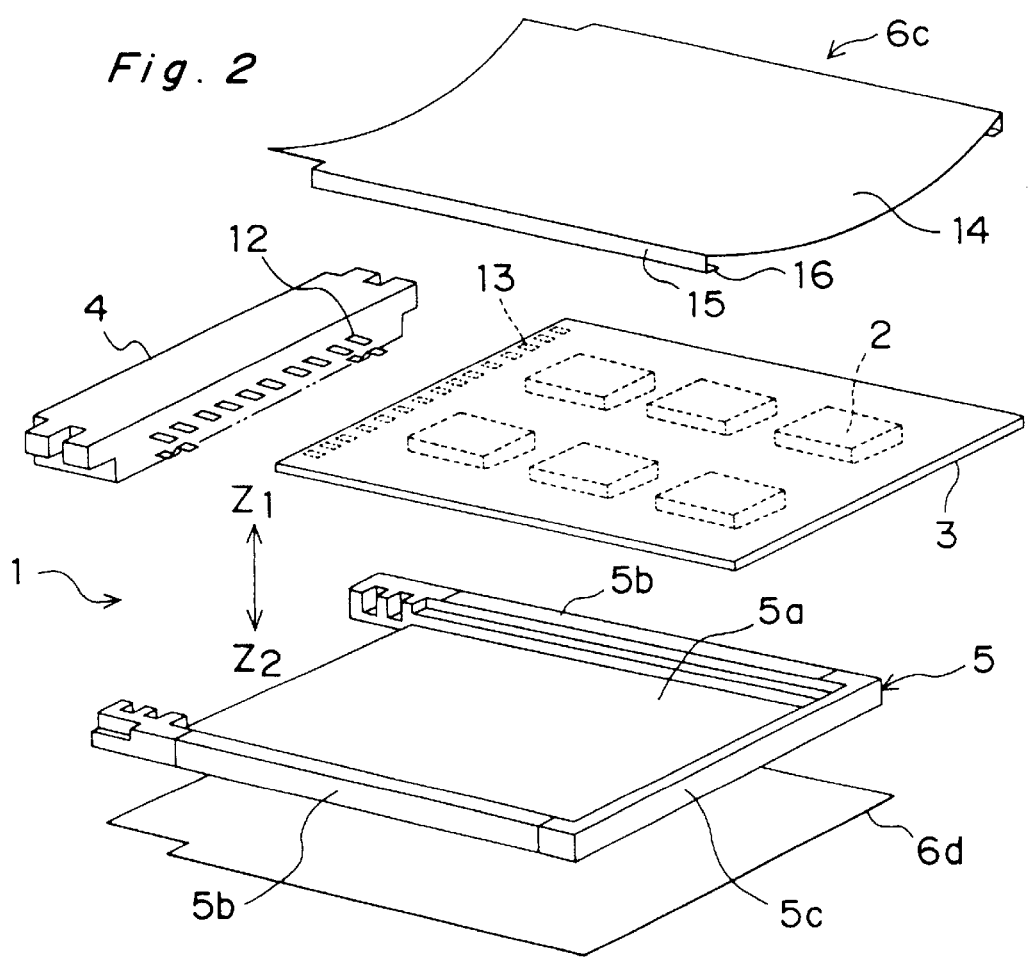
FIG. 2 is an exploded perspective view of the IC card shown in FIG. 1 illustrating the inner structure of the IC card.

As shown in FIG. 2, in the IC card 1, the spreading portion 14 of the first panel 6c is formed in such a manner that the section of the spreading portion 14 cut by a plane perpendicular to the longitudinal direction has a curved shape projecting downward under a condition that the first panel 6c is detached from the frame 5. Thus, when the first panel 6c is attached to the frame 5, the spreading portion 14, which is originally curved, is flattened while causing an elastic deformation thereof , as shown in FIG. 1 Hereupon, in the first panel 6c, there is caused an elastic or restitutive force which compels the spreading portion 14 to return to the original curved state. Since the elastic or restitutive force acts in such a direction that the first panel 6c is pressed to the frame 5, the first panel 6c is strongly pressed to the frame 5 by the elastic or restitutive force. Therefore, the first panel 6c closely contacts with the frame 5, and consequently it is prevented that the first panel 6c swells outward (partially departs from the frame 5).

Third Embodiment

Figure 5:
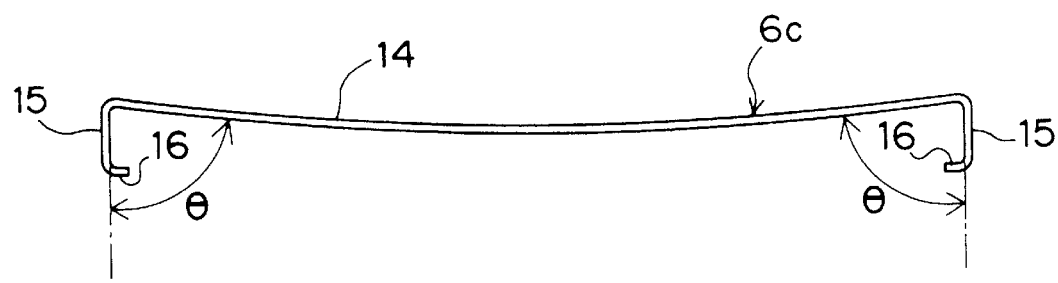
FIG. 5 is a front view of a first panel (upper panel) which is a component of the IC card shown in FIG. 1.

As shown in FIG. 5, in the IC card 1, the first panel 6c is formed in such a manner that the angle θ of each of bending portions formed by the spreading portion 14 and the side portions 15 is an acute angle in the view point of a section of the first panel 6c cut by a plane perpendicular to the longitudinal direction under the condition that the first panel 6c is detached from the frame 5. Thus, when the first panel 6c is attached to the frame 5, the bending portions, which are originally angled acutely, are rectangularly angled (because the corners of the side frames 5b are rectangular) while causing an elastic deformation thereof. Hereupon, in each of the bending portions, there is caused an elastic or restitutive force which compels each of the bending portions to return to the original acute state. Since the elastic or restitutive force acts in such a direction that the first panel 6c is pressed to the frame 5, namely the first panel 6c is hooked to the frame 5, the first panel 6c closely contacts with the frame 5 by the elastic or restitutive force, and consequently it is prevented that the first panel 6c swells outward or leaves the frame 5.

Fourth Embodiment

Figure 3:
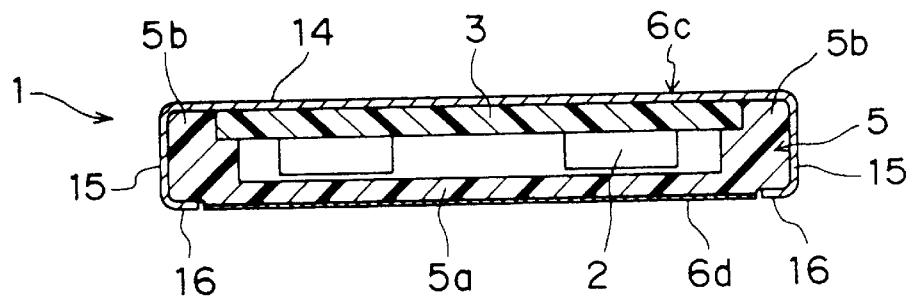
FIG. 3 is a section view of the IC card shown in FIG. 1 along line III—III in FIG. 1.
Figure 4:
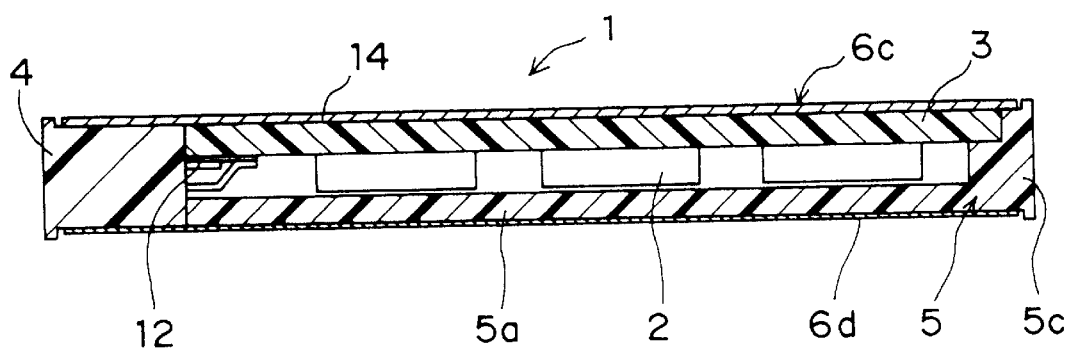
FIG. 4 is a section view of the IC card shown in FIG. 1 along line IV—IV in FIG. 1.

As shown in FIGS. 3 and 4, in the IC card 1, the second panel 6d is made of a thin plate material whose thickness is smaller than that of the first panel 6c. The reason of the above is as follows. That is, in order to cause such a considerably strong elastic or restitutive force in the first panel 6c that the first panel 6c can surely hook to the frame 5, the first panel 6c is required to have a thickness of about 0.2 mm. On the other hand, since the second panel 6d is merely adhered to the lower surface of the frame 5 (bottom plate 5a), the thickness of the second panel 6d is not required to be so much. Therefore, it is preferable that the thickness of the second panel 6d is about 0.05 mm. Thus, since the material cost of the second panel 6d is reduced, the manufacturing cost of the IC card 1 is lowered.

Fifth Embodiment

Figure 6:
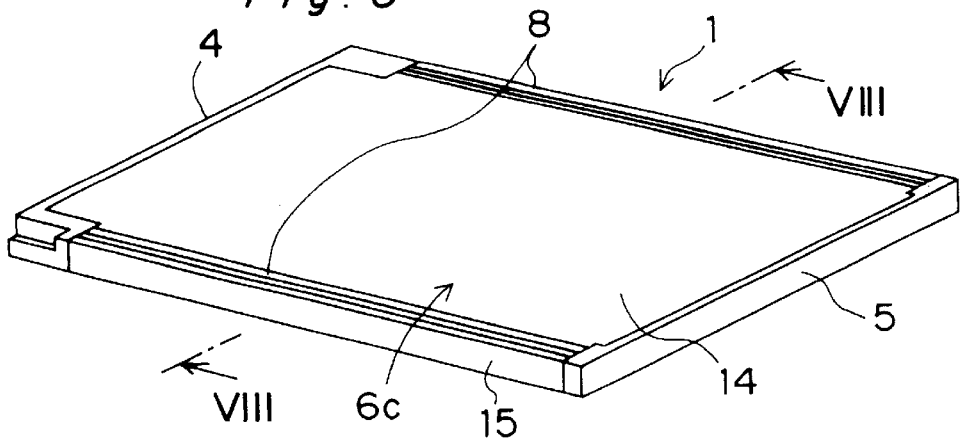
FIG. 6 is a general perspective view of an IC card according to another embodiment of the present invention.

FIG. 6 is a general perspective view of an IC card according to another embodiment of the present invention. Further, FIG. 8 is a section view of the IC card shown in FIG. 6 along line VIII—VIII in FIG. 6.

Figure 8:
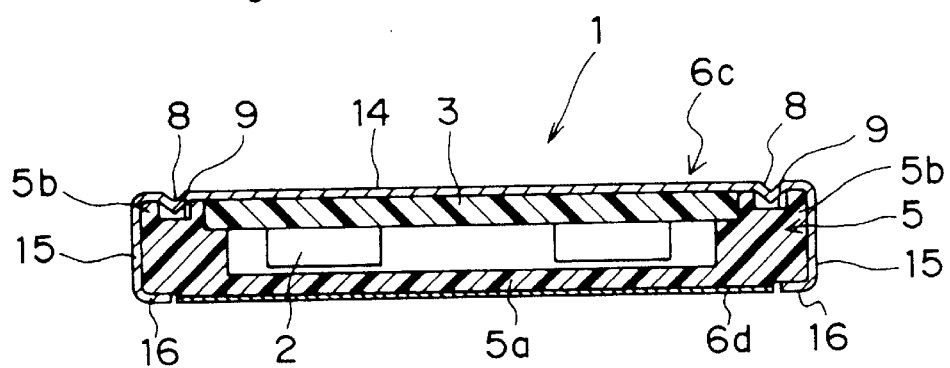
FIG. 8 is a section view of the IC card shown in FIG. 6 along line VIII—VIII in FIG. 6.

As shown in FIGS. 6 and 8, in the IC card 1, the first panel 6c is provided with a rib 8 (joining rib) at each of the left and right end regions of the spreading portion 14 thereof, the rib 8 extending in the longitudinal direction and projecting downward (toward the frame 5) with a U-shape or V-shape) so as to join with the upper surface of the corresponding side frame 5b of the frame 5. Thus, the stiffness of the first panel 6c is raised by the ribs 8 so that the stiffness of the IC card 1 is improved. Further, the coherence between the first panel 6c and the frame 5 is raised by the ribs 8.

Hereupon, the ribs 8 are formed after the first panel 6c has been attached to the frame 5. The ribs 8 are formed by means of a conventional well known process, for example such a process including the step of striking or pressing a predetermined portion in the spreading portion 14 downward (toward the frame 5) using dies or the like. Hence, even if the size of the spreading portion 14 of the first panel 6c in the width direction is slightly larger than the standard size, the spreading portion 14 is slightly shortened in the width direction when the ribs 8 are formed so that the coherence between the first panel 6c and the frame 5 is raised.

Sixth Embodiment

Figure 7:
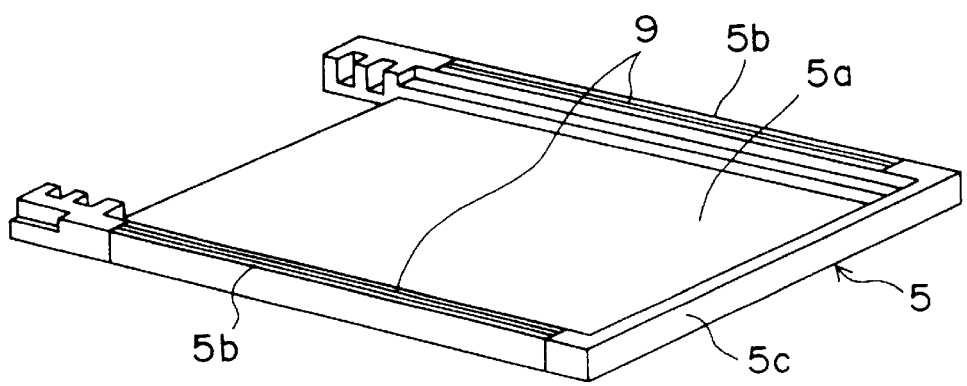
FIG. 7 is a perspective view of a frame which is a component of the IC card shown in FIG. 6.
Figure 9:
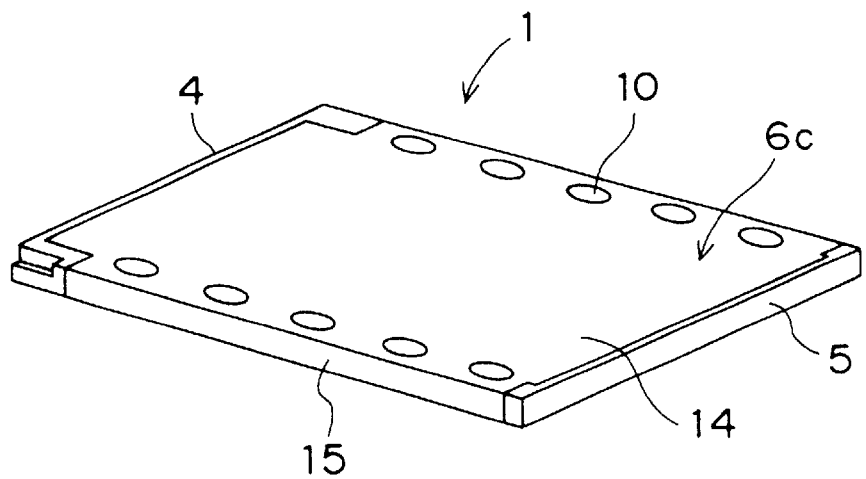
FIG. 9 is a general perspective view of an IC card according to another embodiment of the present invention.

As shown in FIGS. 7 and 8, in the case that the ribs 8 are formed on the spreading portion 14 of the first panel 6c, grooves 9 which can join with the ribs 8 have been already formed on the upper surfaces of the side frames 5b at the positions corresponding to the ribs 8. Each of the grooves 9 acts as an escape place (creephole) for the corresponding rib 8 in the time of forming the rib 8. Hereupon, the grooves 9 may be simultaneously formed in the time of forming the frame 5. Thus, when the ribs 8 are formed after the first panel 6c has been mounted to the frame 5, the ribs 8 may be formed or processed surely and easily, and further the depth (height) of each of the ribs 8 may be easily adjusted Seventh Embodiment As shown in FIG. 9, in an IC card 1 according to another embodiment, the first panel 6c is provided with a plurality of dowels 10 (sinking portions) at each of the left and right end regions of the spreading portion 14 thereof, each of the dowels 10 projecting downward (toward the frame 5) so as to join with the corresponding side frame 5b of the frame 5. Thus, the coherence between the first panel 6c and the frame 5 is raised by the dowels 10. Further, by the dowels 10, it is prevented that there is caused a slip between the first panel 6c and the frame 5 so that the overall stiffness of the IC card 1 is improved. Hereupon, the dowels 10 are formed after the first panel 6c has been attached to the frame 5. The dowels 10 are formed by means of a conventional well known process, for example such a process including the step of striking or pressing a predetermined portions in the spreading portion 14 downward (toward the frame 5) using dies or the like.

Figure 10:
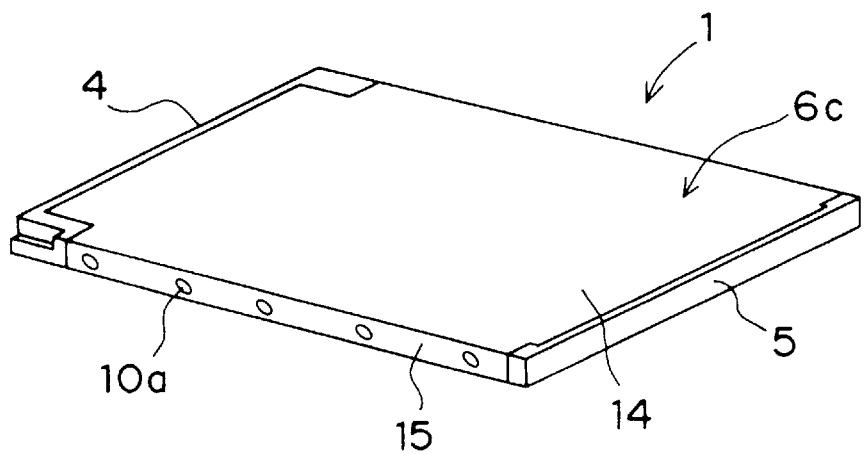
FIG. 10 is a general perspective view of an IC card according to another embodiment of the present invention.

As shown in FIG. 10, the first panel 6c may be provided with a plurality of dowels boa at each of the both side portions 15 thereof, each of the dowels 10a projecting leftward or rightward (toward the frame 5) so as to join with the corresponding side frame 5b of the frame 5. In this case, also, the coherence between the first panel 6c and the frame 5 is raised by the dowels 10a. Further, by the dowels 10a, it is prevented that there is caused a slip between the first panel 6c and the frame 5 so that the overall stiffness of the IC card 1 is improved. Hereupon, the dowels boa are formed after the first panel 6c has been attached to the frame 5.

Eighth Embodiment

Figure 11:
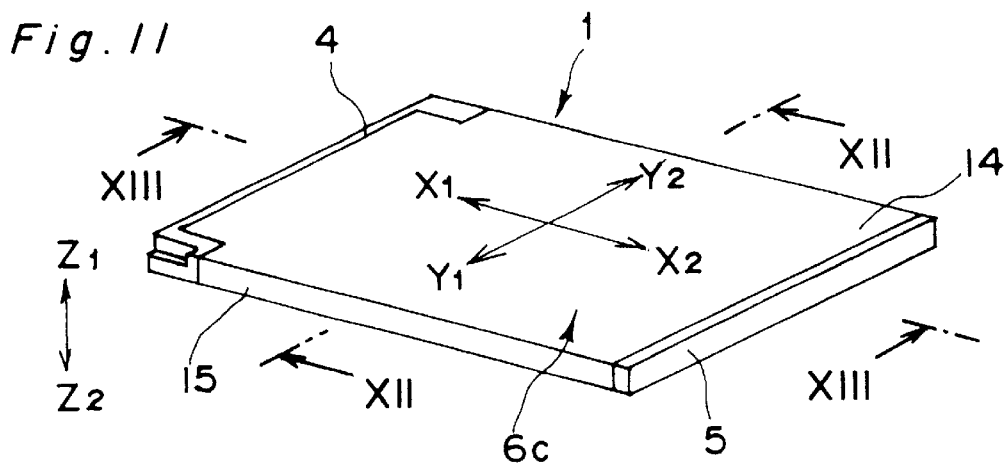
FIG. 11 is a general perspective view of an IC card according to another embodiment of the present invention.
Figure 12:
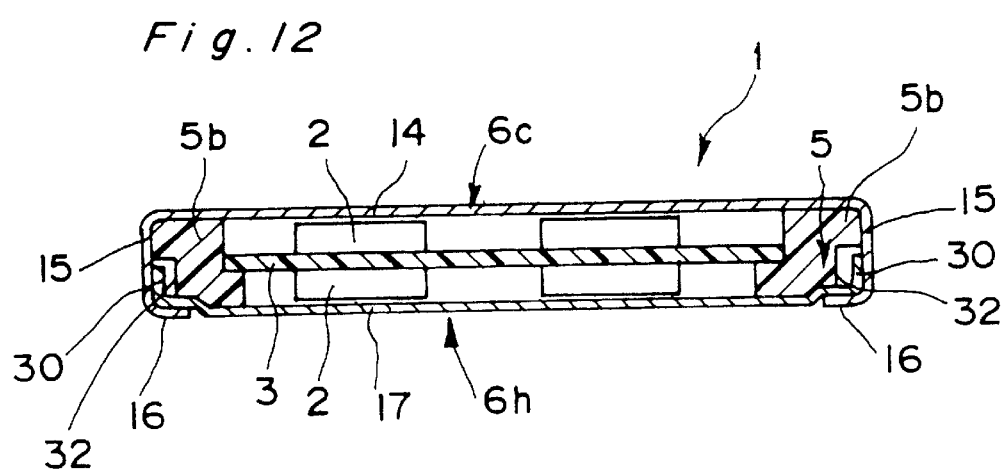
FIG. 12 is a section view of the IC card shown in FIG. 11 along line XII—XII in FIG. 11.
Figure 13:
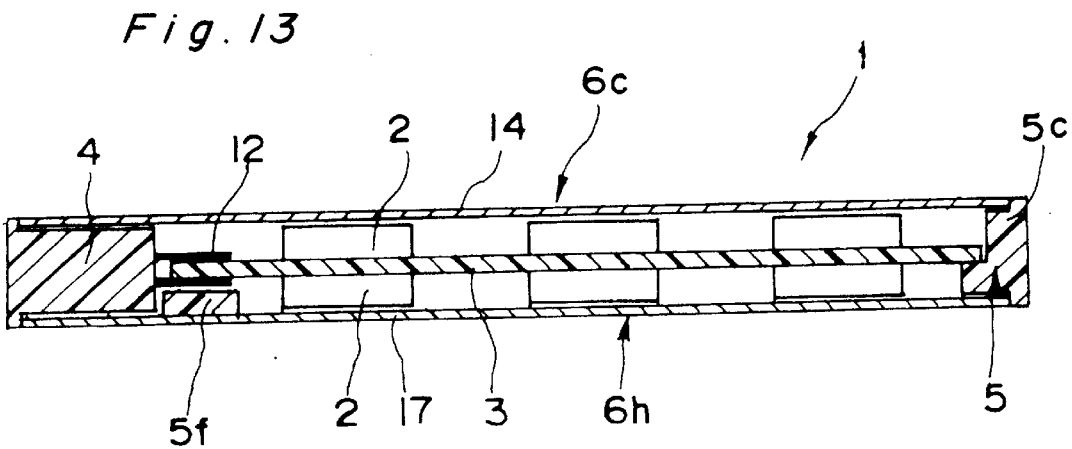
FIG. 13 is a section view of the IC card shown in FIG. 11 along line XIII—XIII in FIG. 11.
Figure 14:
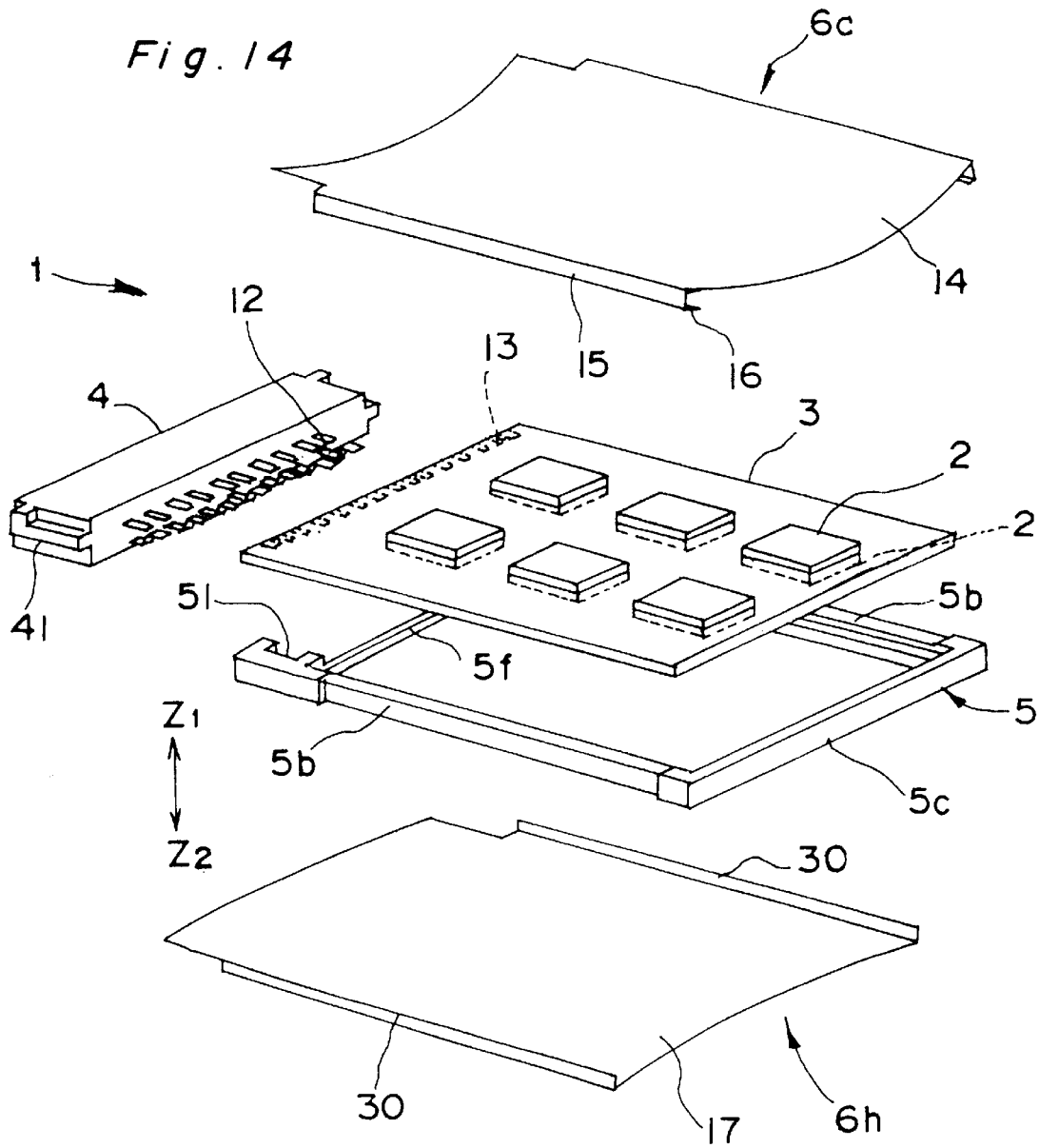
FIG. 14 is an exploded perspective view of the IC card shown in FIG. 11 illustrating the inner structure of the IC card.

FIG. 11 is a general perspective view of an IC card according to another embodiment of the present invention. FIG. 12 is a section view of the IC card shown in FIG. 11 along line XII—XII in FIG. 11. FIG. 13 is a section view of the IC card shown in FIG. 11 along line XIII—XIII in FIG. 11. Further, FIG. 14 is an exploded perspective view of the IC card shown in FIG. 11 illustrating the inner structure of the IC card.

As shown in FIGS. 11 to 14, in the IC card 1, fundamentally, the second panel 6h is directly mounted to the frame 5 in such a manner that each of the left and right end portions 30 thereof is bent in accordance with the outer surface of the corresponding side frame 5b except a little partial region near the front end thereof. Hereupon, each of the side frame 5b is provided with a cut-out 32 at the position that is near the left or right end thereof and is lower half position thereof. Each of the cut-outs 32 is formed by cutting away a portion of the corresponding side frame 5b to inside of the left or right end 30 of the second panel 6h in the width direction. Therefore, when the second panel 6h is mounted to the frame 5, each of the left and right end portions 30 can move inward in the width direction as far as it hits the wall of the corresponding cut-out 32.

On the other hand, the first panel 6c is directly mounted to the frame 5 in such a manner that each of the left and right end portions thereof is bent twice in accordance with the outer surface of the frame 5 or the second panel 6h except a little partial region near the front end thereof so as to cover the corresponding side portion of the second panel 6h and a part of the spreading portion 17, and further each of the hook portions 16 of the first panel 6c is fastened to the lower surface of the spreading portion 17 of the second panel 6h.

In the IC card 1 according to the present embodiment, since the electronic devices 2 are loaded on both of the upper and lower surfaces of the substrate 3, the frame 5 is not provided with such a bottom plate 5a as mentioned in the first to seventh embodiments. Alternatively, the frame 5 is provided with a front frame 5f for raising the strength or stiffness of the frame 5.

The IC card 1 is connected to a system device or outer device (not shown) via the connector 4 so that the memory capacity of the system device may be expanded or the function of the system device may be increased. Hereupon, in the step of assembling the IC card 1, at first the substrate 3 and the connector 4 are joined to each other electrically and mechanically by means of a solder process or the like, and then the assembly composed of the substrate 3 and the connector 4 is housed or held in the frame 5. Thus, after the second panel 6h has been provisionally attached to the frame 5, the upper surface of the IC card 1 (on the way of assembling) is covered with the spreading portion 14 of the first panel 6c, further the left and right side surfaces of the frame 5 are covered with the left and right side surfaces 15 of the first panel 6c respectively, and then the first panel 6c is mechanically fixed to the frame 5.

Thus, in the IC card 1, since the both panels 6c and 6h are fastened to the frame 5 while bending along the outer surfaces of the side frames 5b, the both panels 6c and 6h can be mounted to the frame 5 without using adhesive materials (for example, adhesive sheets). Therefore, the structure of the IC card 1 is simplified and also the manufacturing process of the IC card 1 is simplified. Further, since the left and right end portions 30 of the second panel 6h are covered with the first panel 6c, the view or external appearance of the IC card 1 is improved. Moreover, it is of course that there are achieved following operations or effects, as well as the IC card 1 according to the first embodiment. Namely, anti electromagnetic wave properties of the IC card 1 are improved. Further, electric charges can be discharged without providing a particular contact point for discharging. In addition, a counterplan for ESD can be achieved without providing a particular conducting mechanism for interconnecting the both panels 6c and 6h to each other.

Meanwhile, in the IC card 1, it is necessary that the both panels 6c and 6h surely contact with the frame 5 or the main body of the IC card 1. Particularly, it is required that the center portion of each of the panels 6c and 6h in the width direction surely contacts with the main body of the IC card 1. Thus, in the IC card 1 having the above-mentioned preferable structure, although the contacting property of the panels 6c and 6h against the main body of the IC card 1 is considerably good, it is probable that a further improvement of the contacting property may be achieved. Further, in the IC card 1, since the connector 4 is fixed to the frame 5 by inserting its ear portions 41 into concave portions 51 provided in the frame 5 near the front end of the frame 5 with the aid of pressure, or by fastening hook members (not shown) provided in the frame 5 to the ear portions 41 of the connector 4, the joining strength between the connector 4 and the frame 5 is considerably good. However, it is probable that a further improvement of the joining strength may be achieved.

Ninth Embodiment

Figure 15:
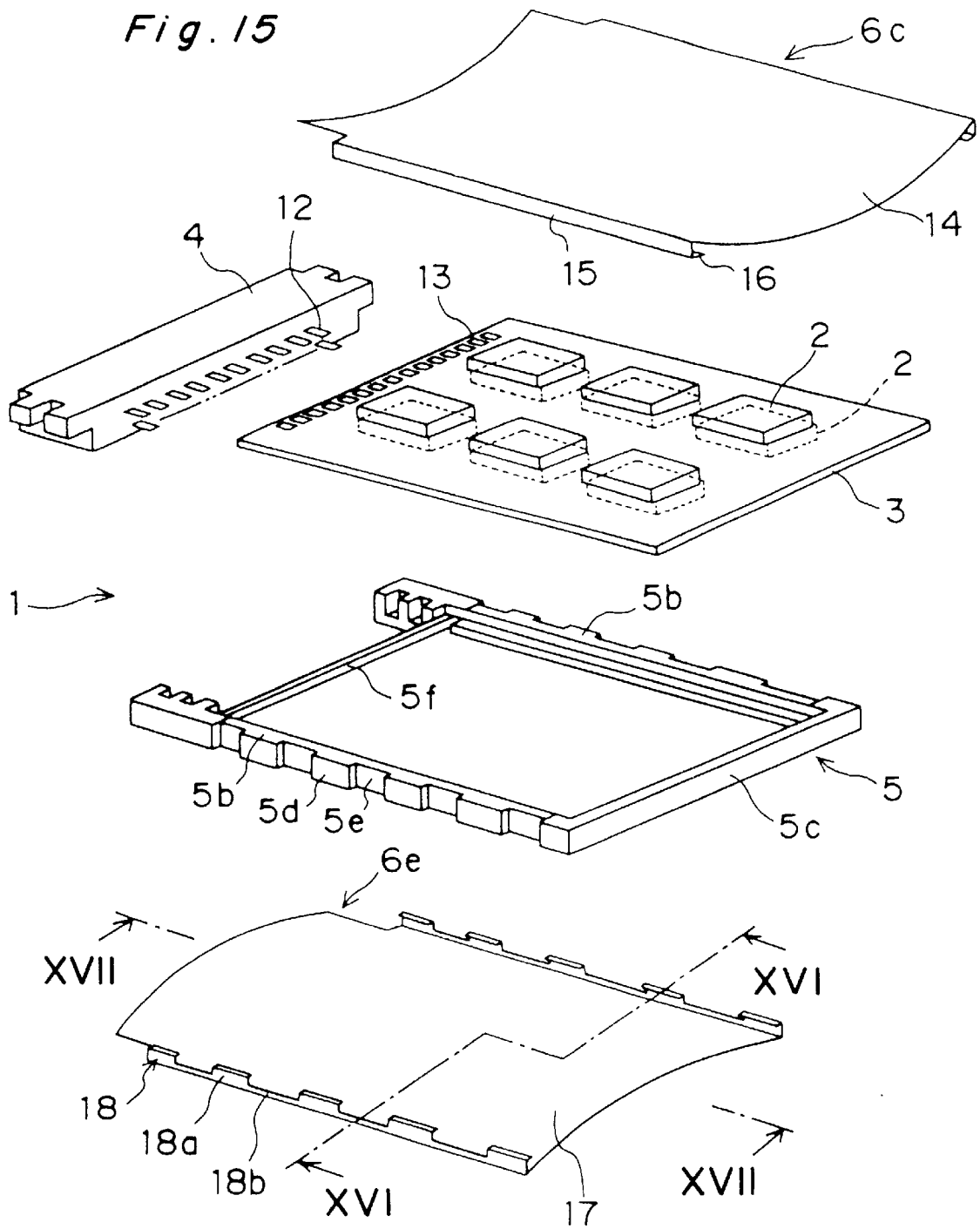
FIG. 15 is an exploded perspective view of an IC card according to another embodiment of the present invention.
Figure 16:
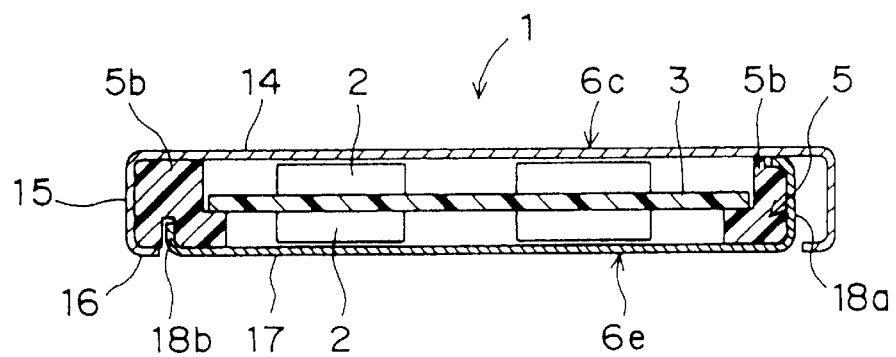
FIG. 16 is a section view of the IC card shown in FIG. 15 along line XVI—XVI in FIG. 15.

FIG. 15 is an exploded perspective view of the IC card according to another embodiment of the present invention. FIG. 16 is a section view of the IC card shown in FIG. 15 along line XVI—XVI in FIG. 15, the IC card having been assembled up. Further, FIG. 17 is a section view of the IC card shown in FIG. 15 along line XVII—XVII in FIG. 15, the IC card having been assembled up.

Figure 17:
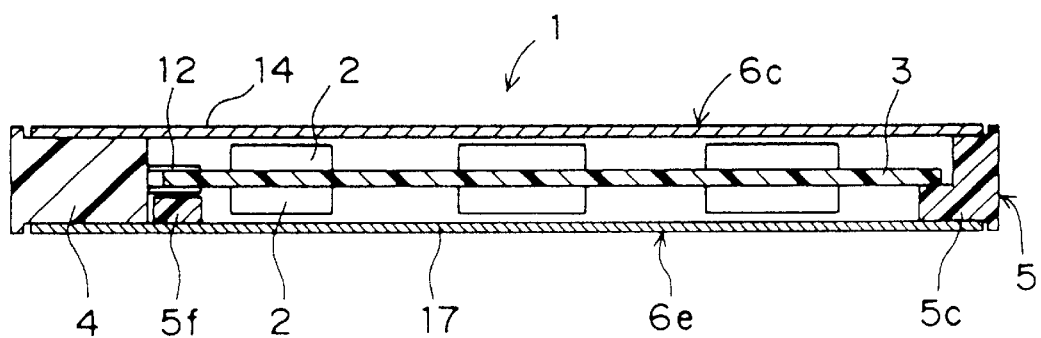
FIG. 17 is a section view of the IC card shown in FIG. 15 along line XVII—XVII in FIG. 15.

As shown in FIGS. 15 to 17, in the IC card 1, fundamentally, the second panel 6e is directly mounted to the frame 5 in such a manner that each of the left and right end portions of the second panel 6e is bent twice in accordance with the outer surface of the corresponding side frame 5b except a little partial region near the front end thereof and further each of edges of the both end portions is fastened to the upper surface of the corresponding side frame 5b. On the other hand, the first panel 6c is directly mounted to the frame 5 without using adhesive sheets in such a manner that each of the left and right end portions of the first panel 6c is bent twice in accordance with the outer surface of the corresponding side frame 5b except the little partial region near the front end thereof and further each of edges of the both end portions is fastened to the lower surface of the corresponding side frame 5b.

More particularly, in the IC card 1, each of the side frame 5b is provided with convex portions 5d swelling outward in the width direction and concave portions 5e sinking inward in the width direction at each of the outer surfaces thereof. In the present embodiment, since the electronic devices 2 are loaded on both of the upper and lower surfaces of the substrate 3, the frame 5 is not provided with such a bottom plate 5a as mentioned in the first to seventh embodiments. Alternatively, the frame 5 is provided with a front frame 5f for raising the strength or stiffness of the frame 5.

Further, in each of the left and right end portions 18 of the second panel 6e, there are formed a plurality of protruding portions 18a and a plurality of low portions 18b. Hereupon, the protruding portions 18a and the low portions 18b are alternately located in the longitudinal direction. Thus, each of the protruding portions 18a is directly mounted to the frame 5 in such a manner that the protruding portion 18a is bent twice in accordance with the outer surface of the corresponding concave portion 5e and further the edge of the protruding portion 18a is fastened to the upper surface of the corresponding side frame 5b. Meanwhile, each of the low portions 18b is inserted into a groove formed on the lower surface of the corresponding side frame 5b. In addition, the spreading portion 17 of the second panel 6e is curved as same as the spreading portions 14 of the first panel 6c (However, their swelling directions are opposite to each other in upper-lower direction thereof) in order to improve its coherence to the frame 5.

On the other hand, the first panel 6c is directly mounted to the frame 5 in such a manner that each of the left and right end portions of the first panel 6c is bent twice in accordance with the outer surface of the corresponding convex portions 5d so as to cover the left or right side portion of the second panel 6e and further each of the hook portions 16 (edges) of first panel 6c is fastened to the lower surface of the corresponding side frame 5b. Hence, in the IC card 1, when the both panels 6c and 6e are mounted to the frame 5, at first, the left and right end portions of the second panel 6e are spread in the width (left-right) direction by hand working or using a suitable tool, and then each of the protruding portions 18a of the second panel 6e is fixed to the corresponding concave portion 5e. Then, the edge of each of the protruding portions 18a is fastened to the upper surface of the corresponding side frame 5b. Thus, the step of mounting the second panel 6e to the frame 5 is completed. Next, the both side portions 15 of the first panel 6c are spread in the width (left-right) direction by hand working or using a suitable tool, and then each of the side portions 15 of the first panel 6c is fixed to the corresponding convex portions 5d. Then, the each of the hook portions 16 (edge) is fastened to the lower surface of the corresponding side frame 5b. Thus, the step of mounting the first panel 6c to the frame 5 is completed.

Thus, in the IC card 1, since the both panels 6c and 6e are fastened to the frame 5 while bending along the outer surfaces of the side frames 5b, the both panels 6c and 6e can be mounted to the frame 5 without using adhesive materials (for example, adhesive sheets). Therefore, the structure of the IC card 1 is simplified and also the manufacturing process of the IC card 1 is simplified. Further, since the left and right end portions 18 of the second panel 6e are covered with the first panel 6c or immersed in the grooves of the side frames 5b, the view or external appearance of the IC card 1 is improved. Moreover, it is of course that there are achieved following operations or effects, as well as the IC card 1 according to the first embodiment. Namely, anti electromagnetic wave properties of the IC card 1 are improved. And, electric charges can be discharged without providing a particular contact point for discharging. In addition, a counterplan for ESD can be achieved without providing a particular conducting mechanism for interconnecting the both panels 6c and 6e to each other.

Tenth Embodiment

Figure 20:
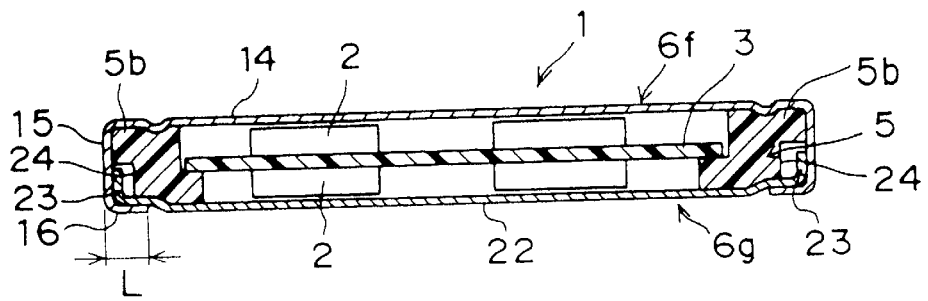
FIG. 20 is a section view of the IC card shown in FIG. 18, the section being cut by a plane perpendicular to the longitudinal direction of the IC card.
Figure 21:
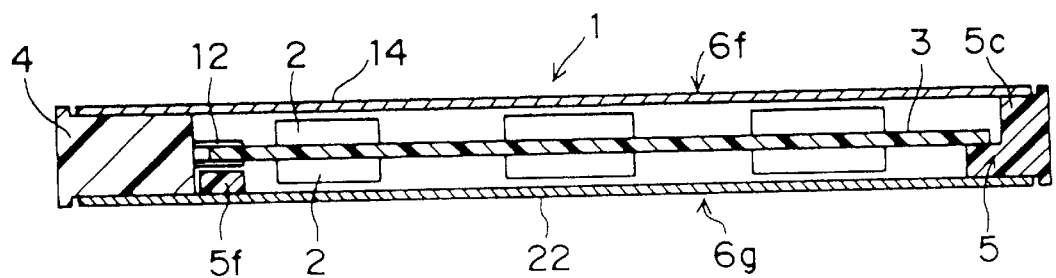
FIG. 21 is a section view of the IC card shown in FIG. 18, the section being cut by a plane perpendicular to the width direction of the IC card.

FIG. 18 is an exploded perspective view of the IC card according to another embodiment of the present invention. And, FIG. 19 is a front view of a first panel which is a component of the IC card shown in FIG. 18. Further, FIG. 20 is a section view of the IC card shown in FIG. 18, the section being cut by a plane perpendicular to the longitudinal direction after the IC card has been assembled up. Moreover, FIG. 21 is a section view of the IC card shown in FIG. 18, the section being cut by a plane perpendicular to the width direction after the IC card has been assembled up.

As shown in FIGS. 18 to 21, in the IC card 1, the first panel 6f is directly mounted to the frame 5 without using adhesive sheets in such a manner that each of the left and right end portions of the first panel 6f is bent twice in accordance with the outer surface of the corresponding side frame 5b within the wide portion (occupies most part of the first panel 6f) of the spreading portion 14 and further each of the hook portions 16 (edges) of the first panel 6f is fastened to the lower surface of the corresponding side frame 5b. Hereupon, the process for mounting the first panel 6f to the frame 5 is, fundamentally, as same as that of the IC card 1 according to the first embodiment Further, the wide portion of the spreading portion 14 of the first panel 6f is provided with a joining rib 20 at each of the left and right end regions of the spreading portion 14 thereof, each of the joining ribs 20 extending in the longitudinal direction and projecting downward (toward the frame 5) with a U-shape or V-shape so as to join with the corresponding side frame 5b. The operations or effects of the joining ribs 20 are as same as those of the ribs 8 of the IC card 1 according to the fifth embodiment. Moreover, the spreading portion 14 is provided with a narrow portion located directly before (front) the wide portion, the narrow portion being located adjacent to the wide portion. The narrow portion has a size shorter than that of the wide portion in the width (left-right) direction. Thus, the narrow portion is provided with a stiffening rib 21 at each of the left and right end regions thereof. Each of the stiffening ribs 21 is formed by extending a slanted half wall 20a of the corresponding U-shaped or V-shaped joining rib 20 longitudinally, which includes two half walls 20a and 20b, the half wall 20a being located at inner (right) side in the width direction.

Thus, in the IC card 1, since the stiffness of the narrow portion of the spreading portion 14 which is provided with no joining ribs 20 is raised by the stiffening ribs 21, it is prevented that the narrow portion bends up or swells outward from the frame 5 so that the stiffness of the first panel 6f is improved. Further, it is of course that there are achieved following operations or effects, as well as the IC card 1 according to the first embodiment. Namely, anti electromagnetic wave properties of the IC card 1 are improved. Moreover, electric charges can be discharged without providing a particular contact point for discharging. In addition, a counterplan for ESD can be achieved without providing a particular conducting mechanism for interconnecting the both panels to each other.

Eleventh Embodiment

As apparent from FIGS. 18 and 20, in the IC card 1 according to another embodiment of the present invention, the second panel 6g is directly mounted to the frame 5 in such a manner that each of the left and right end portions 23 thereof is bent in accordance with the outer surface of the corresponding side frame 5b except a little partial portion near the front end of the IC card 1. Hereupon, each of the side frame 5b is provided with a cut-out 24 at the position that is near the left or right end thereof and is lower half position thereof. Each of the cut-outs 24 is formed by cutting away a portion of the corresponding side frame 5b to inside of the left or right end 23 of the second panel 6g in the width direction. Therefore, when the second panel 6g is mounted to the frame 5, each of the left and right end portions 23 can move inward in the width direction as far as it hits the wall of the corresponding cut-out 24. Hereupon, when each of the left and right end portions 23 moves inward as described above, the spreading portion 22 of the second panel 6g is naturally swelled or curved downward (see FIGS. 22 and 23). Meanwhile, the first panel 6f is directly mounted to the frame 5 in such a manner that each of the left and right end portions thereof is bent twice in accordance with the outer surface of the frame 5 or the second panel 6g except a little partial portion thereof near the front end of the IC card 1 so as to cover the corresponding side portion of the second panel 6g and a part of the spreading portion 22 and further each of the hook portions 16 thereof is fastened to the lower surface of the spreading portion 22 of the second panel 6g.

Thus, in the IC card 1, when it is assembled, the first panel 6f is mounted to the frame 5 after the second panel 6g has been mounted to the frame 5. Hereupon, when the first panel 6f is mounted to the frame 5, preferably, the left and right end portions 23 of the second panel 6g are temporarily displaced (moved) inwardly in the width direction, by elastically deforming the second panel 6g, which has been mounted to the frame 5 already, so as to swell downward, or by applying pressing force in the width direction to the second panel 6g.

Figure 22:
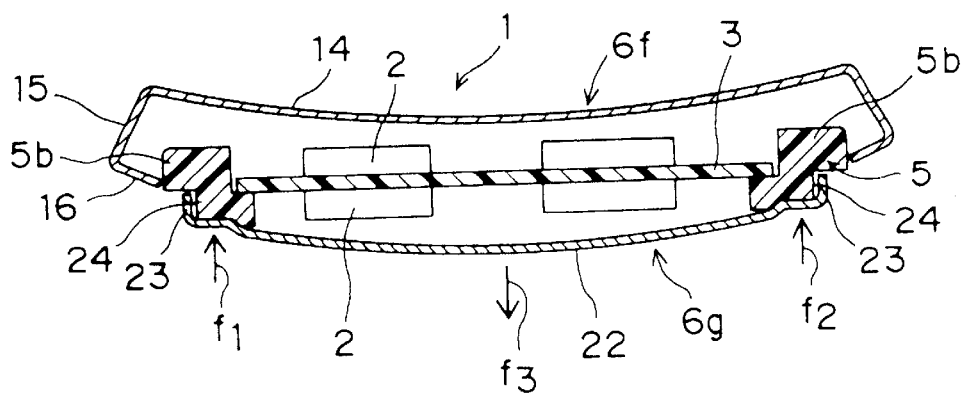
FIG. 22 is a section view similar to FIG. 20 on such an occasion that a first panel is mounted to a frame.
Figure 23:
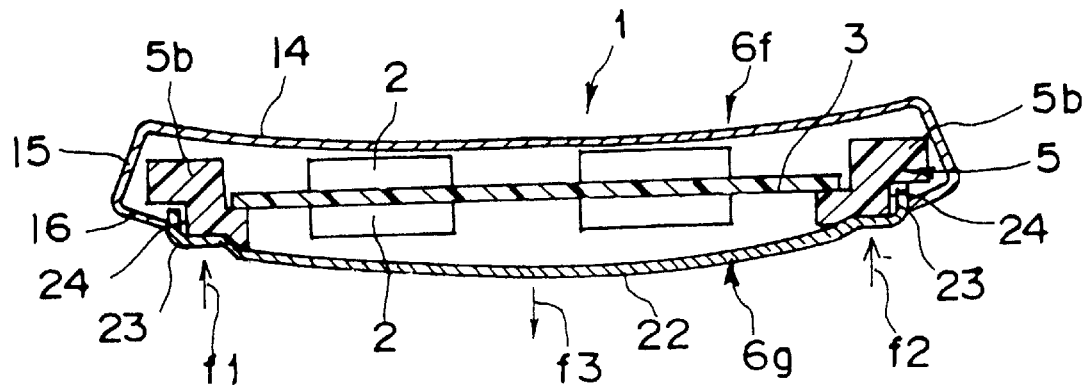
FIG. 23 is another section view similar to FIG. 20 on the occasion that the first panel is mounted to the frame.

As shown in FIGS. 22 and 23, in this case, since the length of the second panel 6g in the width direction is temporarily shortened, the first panel 6f may be mounted to the frame 5 without spreading itself so much in the width direction. Therefore, when the first panel 6f is mounted to the frame 5, it is restrained that the first panel 6f is deformed to reach its permanent deformation region, namely plastical deformation region. In consequence, the associating length or hook length L of the first panel 6f to associate with the second panel 6g can be increased (see FIG. 20) so that the first panel 6f can be surely mounted to the frame 5. In FIGS. 22 and 23, each of arrows f1–f3 indicates the direction along which force should be applied to the second panel 6g when the first panel 6f is mounted to the frame 5.

In addition, in the IC card 1 according to the present embodiment, also, there are justly achieved following operations or effects, as well as the IC card 1 according to the above-mentioned embodiment. Namely, the structure of the IC card 1 is effectively simplified and also the manufacturing process of the IC card 1 is effectively simplified. And, the view or external appearance of the IC card 1 is improved. Further, anti electromagnetic wave properties of the IC card 1 are improved. Moreover, electric charges can be discharged without providing a particular contact point for discharging. Still further, a counterplan for ESD can be achieved without providing a particular conducting mechanism for interconnecting the both panels 6f and 6g to each other.

Twelfth Embodiment

Figure 24:
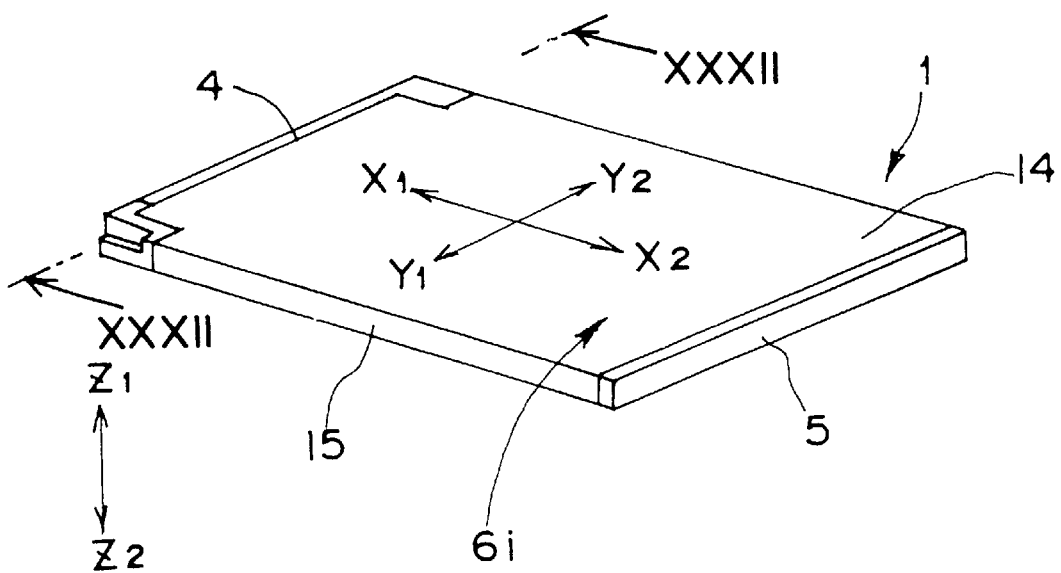
FIG. 24 is a general perspective view of an IC card according to another embodiment of the present invention.
Figure 25:
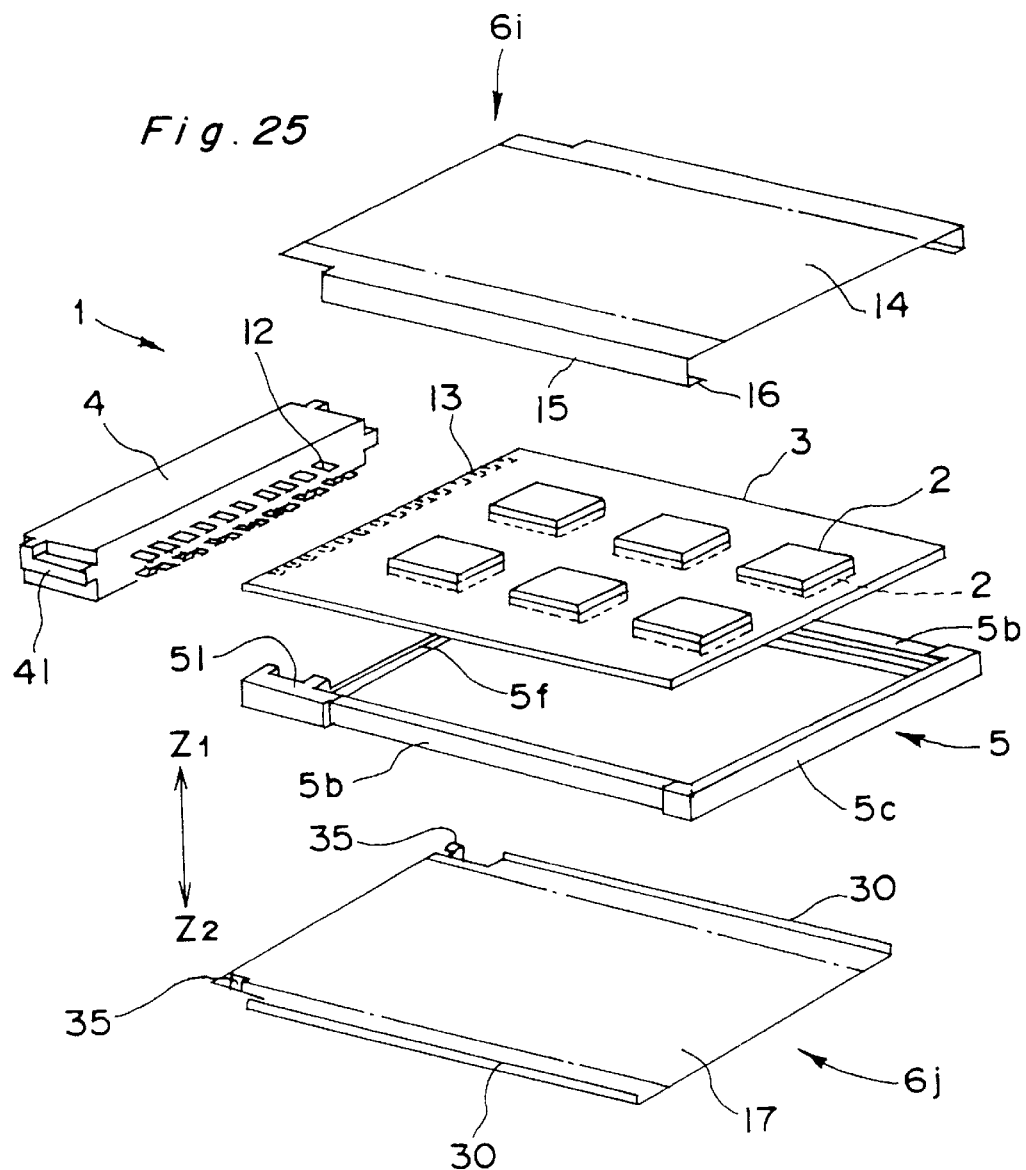
FIG. 25 is an exploded perspective view of the IC card shown in FIG. 24 illustrating the inner structure of the IC card.
Figure 26:
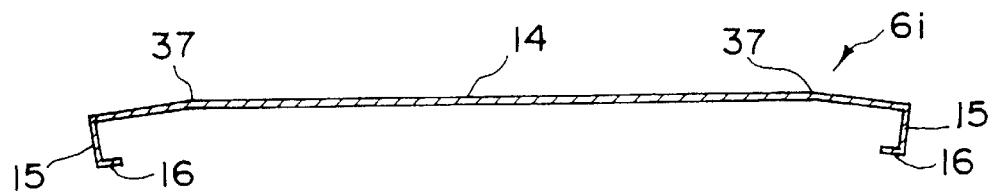
FIG. 26 is a section view of a first panel which is a component of the IC card shown in FIG. 24, the section being cut by a plane perpendicular to the longitudinal direction of the IC card.
Figure 27:
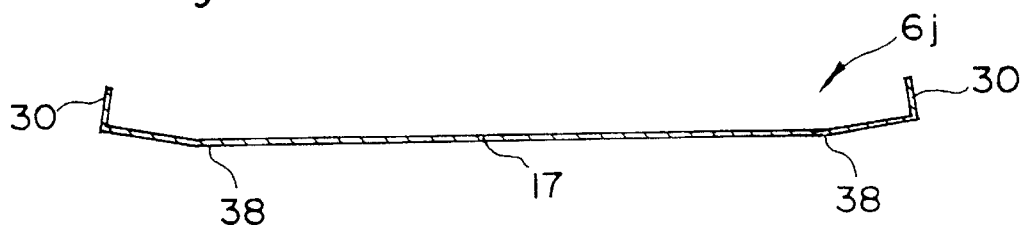
FIG. 27 is a section view of a second panel which is a component of the IC card shown in FIG. 24, the section being cut by the plane perpendicular to the longitudinal direction of the IC card.

FIG. 24 is a general perspective view of an IC card according to another embodiment of the present invention. FIG. 25 is an exploded perspective view of the IC card illustrating the inner structure of the IC card. Further, FIGS. 26 and 27 are cross section views of a first and second panels each of which is a component of the IC card, respectively, each of FIGS. 26 and 27 illustrating the state (shape) that the panel is not attached to the main body of the IC card.

As shown in FIGS. 24 to 27, in the IC card 1, fundamentally as same as the eighth embodiment, the second panel 6j is directly mounted to the frame 5 in such a manner that each of the left and right end portions 30 thereof is bent in accordance with the outer surface of the corresponding side frame 5b except a little partial region near the front end thereof. On the other hand, the first panel 6i is directly mounted to the frame 5 in such a manner that each of the left and right end portions thereof is bent twice in accordance with the outer surface of the frame 5 or the second panel 6j except a little partial region near the front end thereof so as to cover the corresponding side portion of the second panel 6j and a part of the spreading portion 17, and further each of the hook portions 16 of the first panel 6i is fastened to the lower surface of the spreading portion 17 of the second panel 6j.

Hereupon, the spreading portion 14 of the first panel 6i is formed in such a manner that a section of the spreading portion 14 cut by a plane perpendicular to the longitudinal direction has two convex curved portions 37,37 projecting outwardly (upwardly) each of which is located near the corresponding end of the spreading portion 14 and departs from the side frame 5b, in the width direction, under the condition that the first panel 6i is detached from the frame 5. On the other hand, the spreading portion 17 of the second panel 6j is formed in such a manner that a section of the spreading portion 17 cut by a plane perpendicular to the longitudinal direction has two convex curved portions 38,38 projecting outwardly (downward) each of which is located near the corresponding end of the spreading portion 17 and departs from the side frame 5b, in the width direction, under the condition that the second panel 6j is detached from the frame 5. Namely, each of the panels 6i and 6j is provided with the left and right two convex curved portions 37,37 or 38,38 at the left and right positions thereof, respectively, each of the positions being located inside the left or right end bending portion of the panel 6i or 6j and inside the portion at which the panel 6i or 6j grasps the side frame 5b, in the width direction. Hereupon, the spreading portion 14 or 17 of each of the first and second panels 6i and 6j is formed in such a manner that its partial portion between the both convex curved portions 37,37 or 38,38 has a flat shape, namely the section of the partial portion cut by a plane perpendicular to the longitudinal direction has a straight shape, in the width direction, under the condition that the first or second panel 6i or 6j is detached from the frame 5.

In the IC card 1, when the first panel 6i is attached to the frame 5, the spreading portion 14, which is originally curved, is flattened while causing an elastic deformation thereof. Hereupon, in the first panel 6i, there is caused an elastic force which compels the spreading portion 14 to return to the original curved state. Since the elastic force acts in such a direction that the first panel 6i is pressed to the frame 5, the first panel 6i is strongly pressed to the frame 5 by the elastic force. Therefore, the first panel 6i surely contacts with the frame 5. Quite similarly, also, the second panel 6j surely contacts with the frame 5.

Namely, in the IC card 1, each of the bending portions of the first panel 6i, which is located at the left or right end of the panel 6i in the width direction, is bent with a rectangular angle in accordance with the shape of the corresponding side frame 5b, while each of the convex curved portions 37,37 is formed inside the corresponding bending portion in the width direction. In consequence, when the first panel 6i is attached to the frame 5, the elastic force caused in the first panel 6i effectively presses the first panel 6i to the main body of the IC card 1 at the center position in the width direction. Meanwhile, in the above-mentioned IC card 1 according to the eighth embodiment, in which each of the bending portions is bent with an acute angle, since a part of the elastic force caused in the first panel 6c is absorbed in the position at which the first panel 6c contacts with the side frame 5b, the force which is caused by the elastic force and presses the first panel 6c to the main body of the IC card 1 is weakened.

Thus, in the IC card 1 according to the twelfth embodiment, since the both panels 6i and 6j are fastened to the frame 5 while bending along the outer surfaces of the side frames 5b, the both panels 6i and 6j can be mounted to the frame 5 without using adhesive materials (for example, adhesive sheets). Therefore, the structure of the IC card 1 is simplified and also the manufacturing process of the IC card 1 is simplified. Further, since the left and right end portions 30 of the second panel 6j are covered with the first panel 6i, the view or external appearance of the IC card 1 is improved. Moreover, it is of course that there are achieved following operations or effects, as well as the IC card 1 according to the first embodiment Namely, anti electromagnetic wave properties of the IC card 1 are improved. Further, electric charges can be discharged without providing a particular contact point for discharging. In addition, a counterplan for ESD can be achieved without providing a particular conducting mechanism for interconnecting the both panels 6i and 6j to each other.

Thirteenth Embodiment

Figure 28:
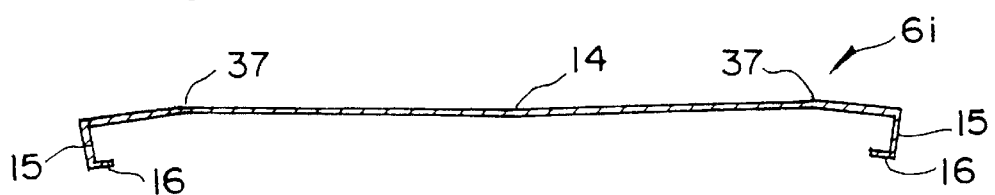
FIG. 28 is a section view of a first panel which is a component of an IC card according to another embodiment of the present invention, the section being cut by a plane perpendicular to the longitudinal direction of the IC card.
Figure 29:
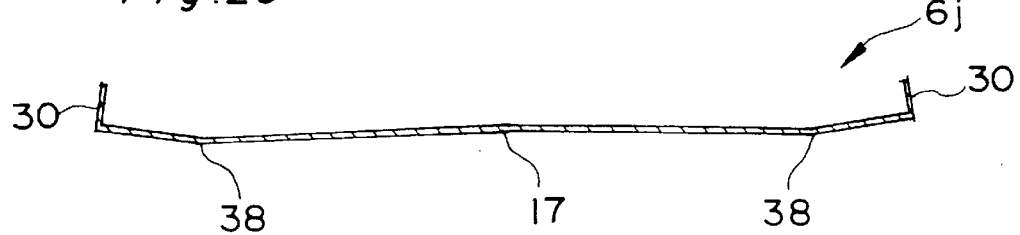
FIG. 29 is a section view of a second panel which is a component of the IC card of FIG. 28, the section being cut by the plane perpendicular to the longitudinal direction of the IC card.

FIGS. 28 and 29 are cross section views of a first and second panels each of which is a component of an IC card according to another embodiment of the present invention, respectively. Hereupon, each of FIGS. 28 and 29 shows the state (shape) in which the panel is not attached to the main body of the IC card.

As shown in FIGS. 28 and 29, in the IC card 1, the spreading portion 14 of the first panel 6i is formed in such a manner that the section of the spreading portion 14 cut by the plane perpendicular to the longitudinal direction has a curved shape projecting inwardly (downward) between the both convex curved portions 37,37 in the width direction under the condition that the first panel 6i is detached from the frame 5. On the other hand, the spreading portion 17 of the second panel 6j is also formed in such a manner that the section of the spreading portion 17 cut by the plane perpendicular to the longitudinal direction has a curved shape projecting inwardly (upwardly) between the both convex curved portions 38,38 in the width direction under the condition that the second panel 6j is detached from the frame 5.

Figure 33:
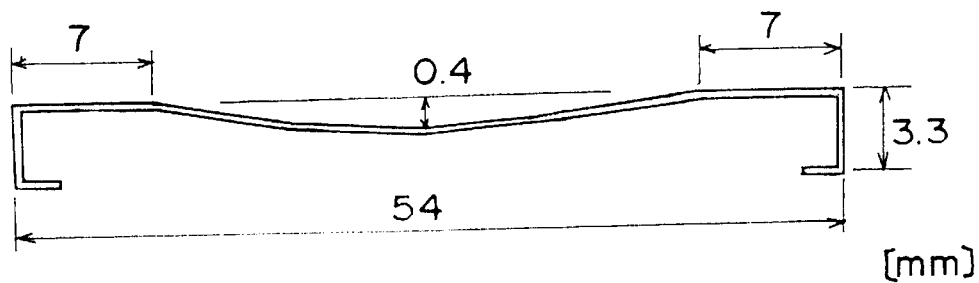
FIG. 33 is a front view of the first panel shown in FIG. 28 illustrating an exemplary size of the panel.
Figure 34:
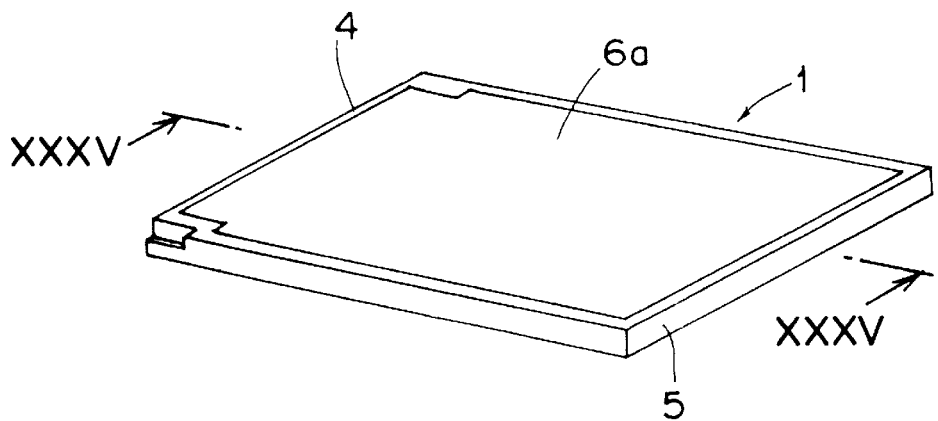
FIG. 34 is a general perspective view of a conventional IC card.

In FIG. 33, there is shown an exemplary size of the first panel 6i having the above-mentioned shape.

In the IC card 1, since the spreading portion 14 or 17 of each of the first and second panels 6i and 6j is inwardly curved at the center portion thereof in the width direction, the contacting property of the first and second panels 6i and 6j against the main body of the IC card 1 may be further improved at the center portions of the panels 6i and 6j in the width direction.

Figure 30:
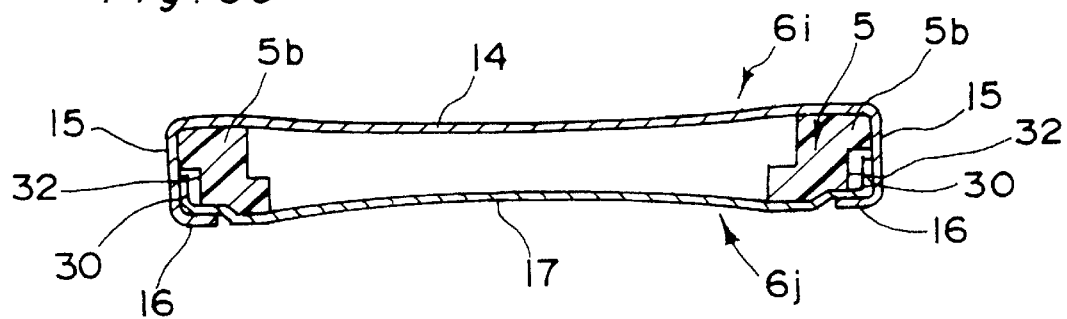
FIG. 30 is a section view of the IC card cut by a plane perpendicular to the longitudinal direction of the IC card conceptually illustrating a frame covered with the first panel shown in FIG. 28 and the second panel shown in FIG. 29.

Hereat, FIG. 30 conceptually (imaginatively) shows the section of the IC card 1 cut by a plane perpendicular to the longitudinal direction, in which the both panels 6i and 6j are attached to the frame 5.

Fourteenth Embodiment

Figure 31:
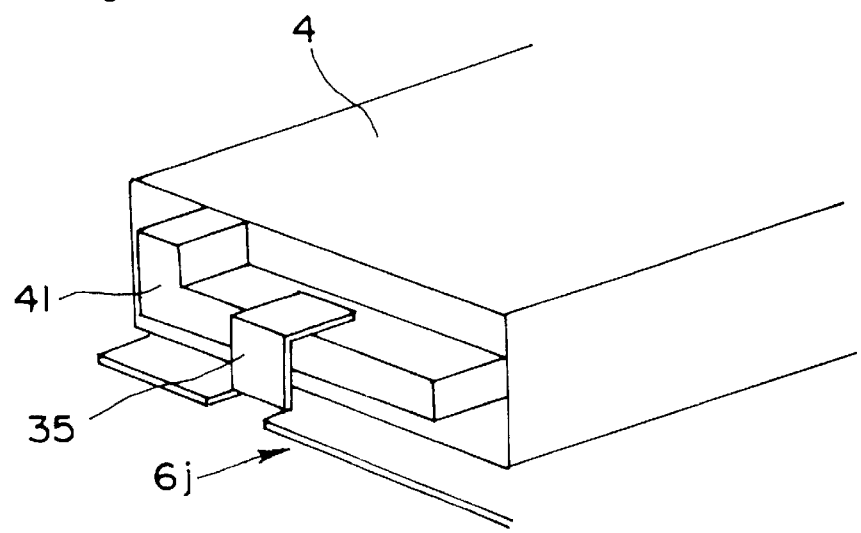
FIG. 31 is an enlarged perspective view of the front end portion of an IC card according to another embodiment of the present invention.
Figure 32:
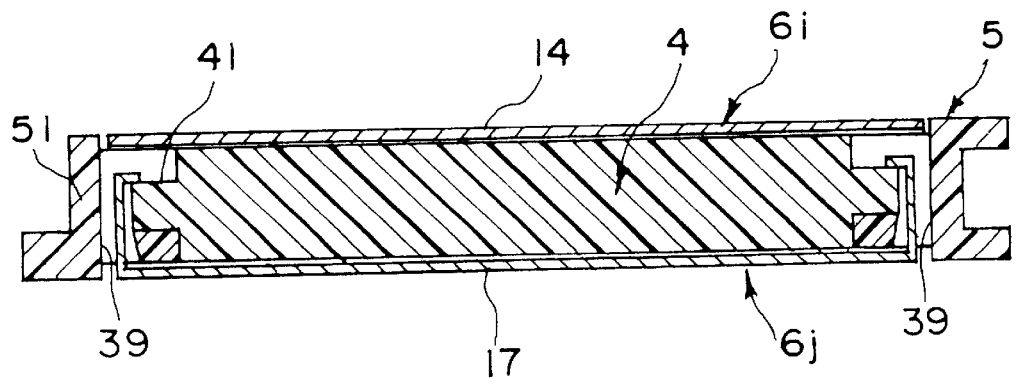
FIG. 32 is a section view of the IC card shown in FIG. 24 along line XXXII—XXXII in FIG. 24.

FIG. 31 is a perspective view of the front end portion of an IC card according to another embodiment of the present invention In FIG. 31, the joining state between the connector and the second panel is shown on an enlarged scale while eliminating the frame in order to clarify the conception of the IC card. FIG. 32 is a section view of the IC card shown in FIG. 24 along line XXXII—XXXII in FIG. 24.

As shown in FIGS. 24, 25, 31 and 32, the IC card 1 according to the fourteenth embodiment is provided with hook portions 35 having elasticity. Each of the hook portion 35 is provided in the second panel 6j (integrally formed with the second panel 6j) at the position that is near the front end of the panel 6j and corresponds to the connector 4. Further, the IC card 1 is provided with slits 39 (or slots) formed in the frame 5 through each of which the corresponding hook portion 35 can be threaded. Hereupon, each of the slits 39 is located at a position that is near the front end of the frame 5 and corresponds to the corresponding hook portion 35. Thus, each of the hook portions 35, which is a part of the second panel 6j, is threaded through the corresponding slit 39 and further hooked firmly to the corresponding ear portion 41 of the connector 4.

In the IC card 1, since each of the hook portions 35 of the second panel 6j is firmly hooked to the corresponding ear portion 41 of the connector 4, the connective strength between the second panel 6j and the connector 4 may be raised. In consequence, the joining strength between the frame 5 and the connector 4 may be raised. Hereupon, since each of the hook portions 35 is made of metal, its durability against the deformation thereof at the time of mounting the hook portion 35 to the ear portion 41, and further the hooking strength is very high after the hook portion 35 has been mounted.

Although, the present invention has been described in terms of preferred embodiments, it will be apparent to those of skill in the art that numerous variations and modifications may be made without departing from the true spirit and scope thereof, as set forth in the following claims.

What is claimed is:

1. An IC card a having substantially flat rectangular shape with a length, a width, and a depth dimension, said IC card comprising:
    an electronic device including an integrated circuit;
    a frame for supporting said electronic device, said frame having first and second frame end surfaces, said first and second frame end surfaces facing opposite directions along the depth direction of said IC card;
    a first panel for covering said first frame end surface; and
    a second panel for covering said second frame end surface; wherein
        said first panel is directly mounted to said frame in such a manner that end portions of said first panel in the IC card width direction are bent at least twice along the IC card length direction to fit the shape of an outer surface of said frame within a partial region of said IC card and an edge of each bent end portion of said first panel is fastened to said second frame end surface; and
        said first panel is provided with a rib at each end region of a spreading portion thereof in the IC card width direction, said rib extending between said spreading portion and said each bent end portion and running continuously along the IC card length direction, said rib projecting from said each bent end portion along the IC card depth direction joining with said frame.

2. The IC card according to claim 1, wherein said first frame end surface is provided with a groove at a position corresponding to a position of said rib, and said groove fitting with said rib.

3. The IC card according to claim 1, wherein said second panel is made of a thin plate material having a smaller thickness than that of said first panel.

4. The IC card according to claim 1, wherein said rib is V-shaped or U-shaped.

5. An IC card having a substantially flat rectangular shape with a length, a width, and a depth dimension, said IC card comprising:
    an electronic device including an integrated circuit;
    a frame for supporting said electronic device, said frame having first and second frame end surfaces, said first and second frame end surfaces facing opposite directions along the depth direction of said IC card;
    a first panel for covering said first frame end surface; and
    a second panel for covering said second frame end surface; wherein
        said first panel is directly mounted to said frame in such a manner that end portions of said first panel in the IC card width direction are bent at least twice along the IC card length direction to fit the shape of an outer surface of said frame within a partial region of said IC card and an edge of each bent end portion of said first panel is fastened to said second frame end surface, and
        said first panel is provided with a dowel at each of both end regions of a spreading portion thereof in the width direction of said IC card, said dowel projecting toward and joining with said frame.

6. The IC card according to claim 5, wherein said second panel is made of a thin plate material having a smaller thickness than that of said first panel.

7. An IC card having a substantially flat rectangular shape with a length, a width, and a depth dimension, said IC card comprising:
    an electronic device including an integrated circuit;
    a frame for supporting said electronic device, said frame having first and second frame end surfaces, said first and second frame end surfaces facing opposite directions along the depth direction of said IC card;
    a first panel for covering said first frame end surface; and
    a second panel for covering said second frame end surface; wherein
        said first panel is directly mounted to said frame in such a manner that end portions of said first panel in the IC card width direction are bent at least twice along the IC card length direction to fit the shape of an outer surface of said frame within a partial region of said IC card and an edge of each bent end portion of said first panel is fastened to said second frame end surface, and
        said first panel is provided with a dowel at each of both side regions thereof which corresponds to a side portion of said frame, said dowel projecting toward and joining with same frame.

8. The IC card according to claim 7, wherein said second panel is made of a thin plate material having a smaller thickness than that of said first panel.

* * * * *